(12) United States Patent
Kusaka

(10) Patent No.: US 8,928,795 B2
(45) Date of Patent: Jan. 6, 2015

(54) BACKSIDE ILLUMINATION IMAGE SENSOR AND IMAGE-CAPTURING DEVICE

(75) Inventor: Yosuke Kusaka, Yokohama (JP)

(73) Assignee: Nikon Corporation, Tokyo (JP)

( * ) Notice: Subject to any disclaimer, the term of this patent is extended or adjusted under 35 U.S.C. 154(b) by 936 days.

(21) Appl. No.: 13/033,187

(22) Filed: Feb. 23, 2011

(65) Prior Publication Data

US 2011/0279727 A1 Nov. 17, 2011

(30) Foreign Application Priority Data

Feb. 25, 2010 (JP) .................................. 2010-040378

(51) Int. Cl.
*H04N 5/225* (2006.01)
*H04N 5/232* (2006.01)
*H01L 27/146* (2006.01)
*H04N 5/369* (2011.01)
*H04N 9/04* (2006.01)

(52) U.S. Cl.
CPC .... *H01L 27/14623* (2013.01); *H01L 27/14627* (2013.01); *H04N 5/3696* (2013.01); *H04N 9/045* (2013.01); *H01L 27/14621* (2013.01)
USPC .......................................... 348/340; 348/345

(58) Field of Classification Search
CPC .......................... H04N 5/23212; H04N 5/2254
USPC .......... 348/345, 340, 354, 349, 273; 257/291, 257/292; 250/201.8
See application file for complete search history.

(56) References Cited

U.S. PATENT DOCUMENTS 6,829,008 B1  12/2004 Kondo et al.
7,265,834 B2   9/2007 Kawakami et al.
7,863,550 B2 *  1/2011 Kusaka ........................ 250/201.8
8,098,321 B2 *  1/2012 Shimoda et al. ............... 348/340
2006/0126066 A1 6/2006 Kawakami et al.
2008/0283724 A1* 11/2008 Goto ........................... 250/201.6

(Continued)

FOREIGN PATENT DOCUMENTS

EP     1 720 340 A1    11/2006
JP     A-11-186530     7/1999

(Continued)

OTHER PUBLICATIONS

Japanese Office Action dated Nov. 29, 2011 issued in Japanese Patent Application No. 2010-040378 (with translation).

(Continued)

*Primary Examiner* — Nhan T Tran
(74) *Attorney, Agent, or Firm* — Oliff PLC

(57) ABSTRACT

A backside illumination image sensor that includes a semiconductor substrate with a plurality of photoelectric conversion elements and a read circuit formed on a front surface side of the semiconductor substrate, and captures an image by outputting, via the read circuit, electrical signals generated as incident light having reached a back surface side of the semiconductor substrate is received at the photoelectric conversion elements includes: a light shielding film formed on a side where incident light enters the photoelectric conversion elements, with an opening formed therein in correspondence to each photoelectric conversion element; and an on-chip lens formed at a position set apart from the light shielding film by a predetermined distance in correspondence to each photoelectric conversion element. The light shielding film and an exit pupil plane of the image forming optical system achieve a conjugate relation to each other with regard to the on-chip lens.

5 Claims, 20 Drawing Sheets

(56) References Cited

U.S. PATENT DOCUMENTS

| | | | |
|---|---|---|---|
| 2009/0167927 A1* | 7/2009 | Kusaka | 348/345 |
| 2009/0295964 A1* | 12/2009 | Utagawa et al. | 348/345 |
| 2010/0013947 A1* | 1/2010 | Oikawa | 348/222.1 |
| 2010/0157094 A1* | 6/2010 | Takamiya | 348/229.1 |
| 2011/0096212 A1 | 4/2011 | Oikawa | |

FOREIGN PATENT DOCUMENTS

| | | |
|---|---|---|
| JP | A-2003-51585 | 2/2003 |
| JP | B2-3592147 | 11/2004 |
| JP | A-2005-209676 | 8/2005 |
| JP | A-2005-294647 | 10/2005 |
| JP | A-2006-19653 | 1/2006 |
| JP | A-2006-80457 | 3/2006 |
| JP | A1-WO 2006/046396 | 5/2006 |
| JP | A-2007-88057 | 4/2007 |
| JP | A-2007-155930 | 6/2007 |
| JP | A-2007-294552 | 11/2007 |
| JP | A-2008-103478 | 5/2008 |
| JP | A-2009-153178 | 7/2009 |
| JP | A 2009-164385 | 7/2009 |
| JP | A-2010-20015 | 1/2010 |
| WO | WO 2004/008196 A1 | 1/2004 |

OTHER PUBLICATIONS

Office Actions issued in Japanese Patent Application No. 2010-040378 on Feb. 21, 2012 (with translation).

* cited by examiner

BACKSIDE ILLUMINATION IMAGE SENSOR AND IMAGE-CAPTURING DEVICE

INCORPORATION BY REFERENCE

The disclosure of the following priority application is herein incorporated by reference: Japanese Patent Application No. 2010-040378 filed Feb. 25, 2010.

BACKGROUND OF THE INVENTION

1. Field of the Invention

The present invention relates to a backside illumination image sensor and an image-capturing device.

2. Description of Related Art

The performance of an image sensor at low brightness is often improved by forming on-chip lenses, each in correspondence to one of the photoelectric conversion elements, and illuminating each photoelectric conversion element with condensed light. The backside illumination image sensor disclosed in Japanese Laid Open Patent Publication No. 2009-164385 captures an image as signals generated with light illuminating the back side of a semiconductor substrate, which is received at photoelectric conversion elements disposed in the semiconductor substrate, are output through a read circuit formed on the front side of the semiconductor substrate. In order to receive red-color light with a significant wavelength at high efficiency, photoelectric conversion elements (photodiodes) formed to assure a thickness of approximately 10 μm are disposed at the backside illumination image sensor. The surface of each photoelectric conversion element and the corresponding on-chip lens are set over a short distance from each other and the light having passed through the on-chip lens is condensed within the photoelectric conversion element.

SUMMARY OF THE INVENTION

The on-chip lenses in the backside illumination image sensor in the related art described above are designed by giving priority to condensing performance and regulating the amount of shading in the periphery of the image plane. However, since they are designed without fully taking into consideration the positional relationship between the backside illumination image sensor and the exit pupil of the image forming optical system, the linearity of the relationship between the aperture F number at the image forming optical system and the level of the signals output from the backside illumination image sensor cannot be kept intact, necessitating that correction be executed as part of exposure control, particularly at low F numbers.

According to the present invention, the linearity representing the relationship between the aperture F number at the image forming optical system and the level of the signals output by the backside illumination image sensor can be maintained with ease.

According to the 1st aspect of the present invention, a backside illumination image sensor that includes a semiconductor substrate with a plurality of photoelectric conversion elements formed thereat and a read circuit formed on a side where a front surface of the semiconductor substrate is present, and captures an image by outputting, via the read circuit, electrical signals generated as incident light having passed through an image forming optical system and having reached a side where a back surface of the semiconductor substrate is present, is received at the plurality of photoelectric conversion elements comprises: a light shielding film formed on a side where incident light enters the plurality of photoelectric conversion elements, with an opening formed therein in correspondence to each of the plurality of photoelectric conversion elements; and an on-chip lens formed at a position set apart from the light shielding film by a predetermined distance in correspondence to each of the plurality of photoelectric conversion elements. The light shielding film and an exit pupil plane at which an exit pupil of the image forming optical system is present achieve a conjugate relation to each other with regard to the on-chip lens.

According to the 2nd aspect of the present invention, in the backside illumination image sensor according to the 1st aspect, it is preferred that a radius of curvature R of the on-chip lens, a distance D from an apex of the on-chip lens to the light shielding film and an average refractive index n of a medium present between the on-chip lens and the light shielding film achieve a relationship expressed as; $D=R \cdot n/(n-1)$.

According to the 3rd aspect of the present invention, in the backside illumination image sensor according to the 2nd aspect, it is preferred that the plurality of photoelectric conversion elements are disposed in a two-dimensional grid array; and a pitch P of the two-dimensional grid array, a smallest F number F0 of the exit pupil of the image forming optical system and the distance D achieve a relationship expressed as; $F0 \cdot P \cdot n > D > P \cdot n/(2 \cdot (n-1))$.

According to the 4th aspect of the present invention, in the backside illumination image sensor according to the 3rd aspect, it is preferred that the radius of curvature over a periphery of the on-chip lens is greater than the radius of curvature at a central area of the on-chip lens.

According to the 5th aspect of the present invention, in the backside illumination image sensor according to the 1st aspect, it is preferred that the plurality of photoelectric conversion elements include a pair of focus detection photoelectric conversion elements; and the pair of focus detection photoelectric conversion elements generates a pair of focus detection signals pertaining to an image forming condition for the image forming optical system by receiving a pair of light fluxes having passed through a pair of areas in the image forming optical system.

According to the 6th aspect of the present invention, in the backside illumination image sensor according to the 5th aspect, it is preferred that at least either a first opening formed with an offset toward one side relative to an optical axis of the on-chip lens, or a second opening formed with an offset toward a side opposite from the one side relative to the optical axis of the on-chip lens, is formed as the opening in the light shielding film; and the pair of focus detection signals include an electrical signal generated by one of the pair of focus detection photoelectric conversion elements by receiving one light flux in the pair of light fluxes, which passes through the first opening, and an electrical signal generated by another focus detection photoelectric conversion element in the pair of focus detection photoelectric conversion elements by receiving another light flux in the pair of light fluxes, which passes through the second opening, and the image forming condition for the image forming optical system can be detected based upon a phase difference manifested by the pair of focus detection signals.

According to the 7th aspect of the present invention, in the backside illumination image sensor according to the 1st aspect, it is preferred that the backside illumination image sensor further comprises: a light shielding member that prevents entry of passing light, which is part of the incident light that passes through the on-chip lens, into a photoelectric conversion element corresponding to an adjacent on-chip lens adjacent to the on-chip lens, among the plurality of photoelectric conversion elements. The light shielding member is disposed between the on-chip lens and the light shielding film.

According to the 8th aspect of the present invention, in the backside illumination image sensor according to the 7th aspect, it is preferred that the light shielding member is a barrier member disposed parallel to an optical axis of the on-chip lens; and an anti-reflection film is formed at a surface of the barrier member so as to prevent reflection of the passing light.

According to the 9th aspect of the present invention, in the backside illumination image sensor according to the 7th aspect, it is preferred that the light shielding member includes a first color filter disposed near the on-chip lens and a second color filter assuming a color matching the color of the first color filter, which is disposed near the opening; and a color of the light shielding member is different from a color of a light shielding member disposed in conjunction with the adjacent on-chip lens adjacent to the on-chip lens.

According to the 10th aspect of the present invention, in the backside illumination image sensor according to the 1st aspect, it is preferred that a transparent medium is filled between the on-chip lens and the light shielding film so as to not leave any unfilled gap; and the transparent medium is constituted of a material different from a material constituting the on-chip lens.

According to the 11th aspect of the present invention, in the backside illumination image sensor according to the 10th aspect, it is preferred that a color filter is disposed between the on-chip lens and the transparent medium; and a wavelength range of light transmitted through the transparent medium includes a wavelength range of light transmitted through the color filter.

According to the 12th aspect of the present invention, a backside illumination image sensor that includes a semiconductor substrate with a plurality of photoelectric conversion elements, containing a pair of focus detection photoelectric conversion elements, formed thereat and a read circuit formed on a side where a front surface of the semiconductor substrate is present, and captures an image by outputting, via the read circuit, electrical signals generated as incident light having passed through an image forming optical system and having reached a side where a back surface of the semiconductor substrate is present, is received at the plurality of photoelectric conversion elements comprises: a light shielding film formed on a side where the incident light enters the plurality of photoelectric conversion elements, with at least either a first opening or a second opening formed therein in correspondence to each of the plurality of photoelectric conversion elements; and an on-chip lens formed at a position set apart from the light shielding film by a predetermined distance in correspondence to each of the plurality of photoelectric conversion elements. The first opening is formed with an offset toward one side relative to an optical axis of the on-chip lens; the second opening is formed with an offset toward a side opposite from the one side relative to the optical axis of the on-chip lens; the pair of focus detection photoelectric conversion elements generates a pair of focus detection signals pertaining to an image forming condition for the image forming optical system by receiving a pair of light fluxes having passed through a pair of areas in the image forming optical system; and the pair of focus detection signals include an electrical signal generated by one of the pair of focus detection photoelectric conversion elements by receiving one light flux in the pair of light fluxes, which passes through the first opening, and an electrical signal generated by another focus detection photoelectric conversion element in the pair of focus detection photoelectric conversion elements by receiving another light flux in the pair of light fluxes, which passes through the second opening, and the image forming condition for the image forming optical system can be detected based upon a phase difference manifested by the pair of focus detection signals.

According to the 13th aspect of the present invention, an image-capturing device comprises: a backside illumination image sensor according to the 1st aspect; and an optical system. The optical system is the image forming optical system that emits the incident light to be used to form an image on the backside illumination image sensor.

DESCRIPTION OF PREFERRED EMBODIMENTS

Figure 1:
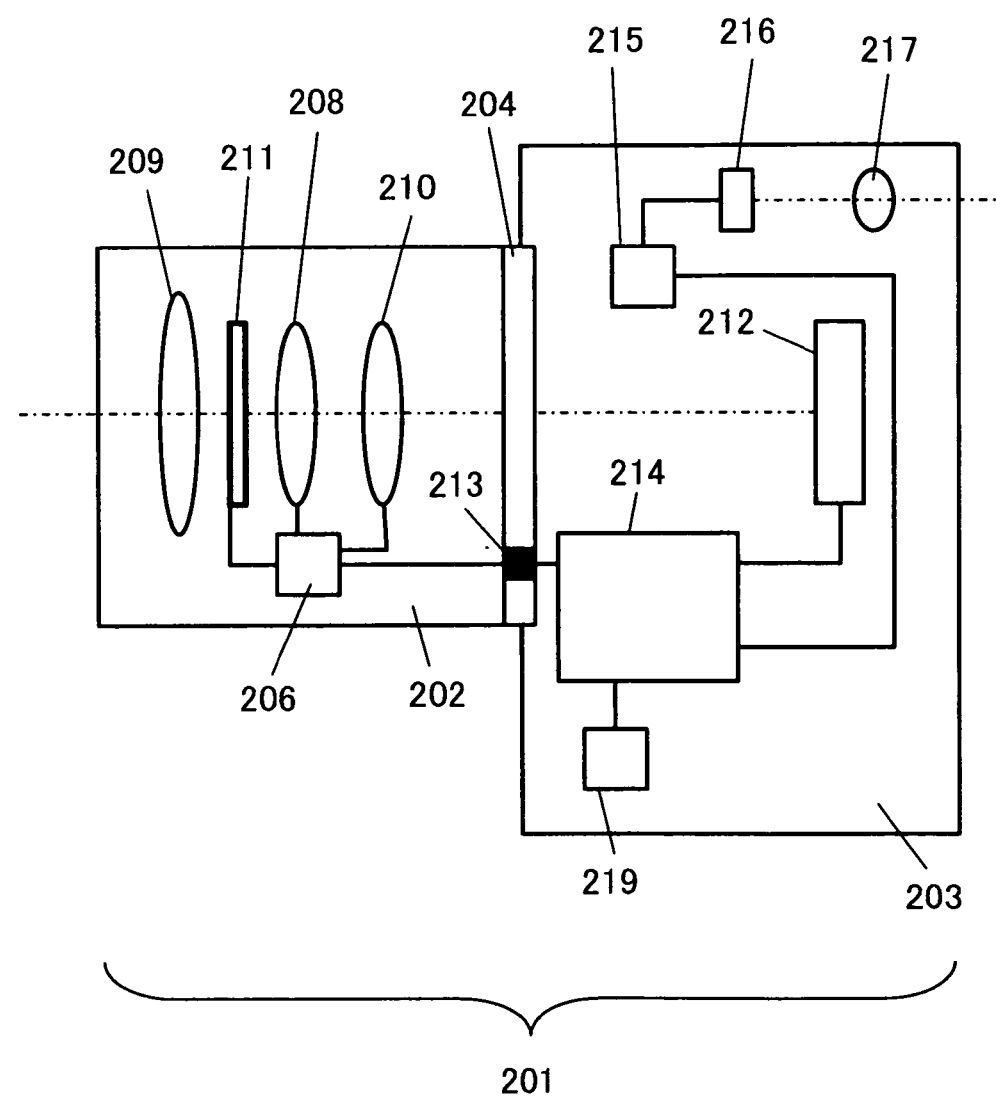
FIG. 1 is a latitudinal sectional view, showing the structure of the digital still camera achieved in an embodiment.

The following is a description of a digital still camera used in conjunction with interchangeable lenses, representing an example of an image-capturing device equipped with a backside illumination sensor (hereafter simply referred to as an "image sensor") achieved in an embodiment of the present invention is now explained. FIG. 1 is a lateral sectional view of the structure adopted in the digital still camera in the embodiment. A digital still camera 201 achieved in the embodiment comprises an interchangeable lens 202 and a camera body 203. The interchangeable lens 202 is mounted at the camera body 203 via a mount unit 204. Namely, the interchangeable lens 202 that includes various image forming optical systems can be mounted at the camera body 203 via the mount unit 204.

The interchangeable lens 202 includes a a lens 209, a zooming lens 208, a focusing lens 210, an aperture 211, a lens drive control device 206 and the like. The lens drive control device 206 is constituted with a microcomputer, a memory, a drive control circuit and the like (none shown). The lens control device 206 executes drive control of the focusing lens 210 and the aperture 211 respectively for focus adjustment and aperture opening diameter adjustment and detects the states of the zooming lens 208, the focusing lens 210 and the aperture 211. The lens drive control device 206 also engages in communication with a body drive control device 214 to be detailed later to transmit lens information to the body drive control device and receive camera information (defocus amount, aperture value and the like) from the body drive control device. The aperture 211 forms an opening with a variable opening diameter, centered on the optical axis, so as to adjust the amount of light and adjust the extent of blurring.

An image sensor 212, the body drive control device 214, a liquid crystal display element drive circuit 215, a liquid crystal display element 216, an eyepiece lens 217, a memory card 219 and the like are disposed at the camera body 203. Image-capturing pixels are two-dimensionally arrayed in image-capturing pixel rows and image-capturing pixel columns at the image sensor 212, and focus detection pixels are also built into the image sensor over areas corresponding to focus detection positions (focus detection areas). The image sensor 212 will be described in detail later.

The body drive control device 214 includes a microcomputer, a memory, a drive control circuit and the like. The body drive control device 214 repeatedly executes drive control for the image sensor 212, a read of pixel signals from the image sensor 212, a focus detection operation based upon the pixel signals from focus detection pixels, and focus adjustment for the interchangeable lens 202. It also processes and records image signals and controls operations of the digital still camera 201. In addition, the body drive control device 214 engages in communication with the lens drive control device 206 via an electrical contact point 213 to receive the lens information and transmit the camera information.

The liquid crystal display element 216 functions as an electronic viewfinder (EVF). A live view image expressed with image data read out from the image sensor 212, which is brought up on display at the liquid crystal display element 216 by the liquid crystal display element drive circuit 215, can be observed by the photographer via the eyepiece lens 217. The memory card 219 is an image storage medium in which image data expressing an image captured by the image sensor 212 are stored.

A subject image is formed on the image sensor 212 with a light flux having passed through the interchangeable lens 202. The subject image undergoes photoelectric conversion at the image sensor 212. Subsequently, pixel signals output from the image-capturing pixels and the focus detection pixels as a result of the photoelectric conversion are transmitted to the body drive control device 214.

The body drive control device 214 calculates the defocus amount indicating the extent of defocusing based upon pixel signals output from the focus detection pixels at the image sensor 212 and transmits this defocus amount to the lens drive control device 206. In addition, the body drive control device 214 generates image data by processing the pixel signals originating from the image-capturing pixels at the image sensor 212 and stores the image data thus generated into the memory card 219. It also provides live view image signals read out from the image sensor 212 to the liquid crystal display element drive circuit 215 so as to bring up a live view image on display at the liquid crystal display element 216. Moreover, the body drive control device 214 provides aperture control information to the lens drive control device 206 to enable opening control of the aperture 211.

The lens drive control device 206 updates the lens information in correspondence to the current focusing state, zooming state and aperture setting state, F number for the maximum aperture number and the like. More specifically, the lens drive control device 206 detects the positions of the zooming lens 208 and the focusing lens 210 and the aperture value set for the aperture 211. It then calculates correct lens information based upon the lens positions and the aperture value. Alternatively, it may select the lens information corresponding to the lens positions and the aperture value from a lookup table prepared in advance.

The lens drive control device 206 calculates a lens drive quantity indicating the extent to which the lens is to be driven based upon the defocus amount having been received and drives the focusing lens 210 to a focusing position based upon the lens drive quantity. The lens drive control device 206 also drives the aperture 211 in correspondence to the aperture value it has received.

Figure 2:
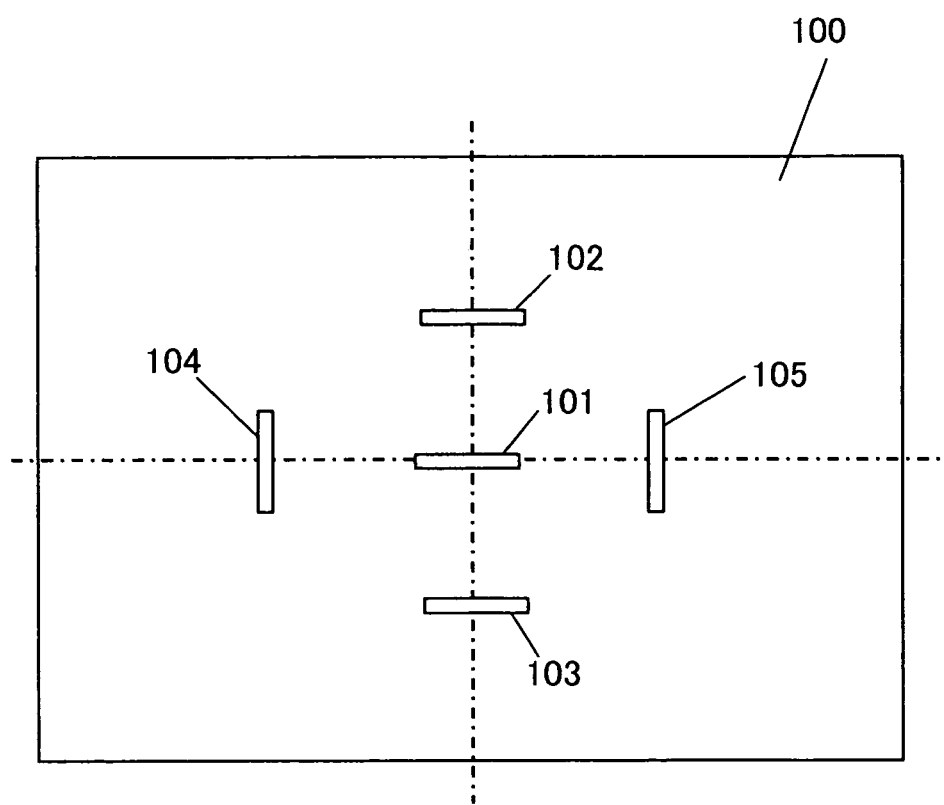
FIG. 2 shows focus detection positions set on the photographic image plane of the interchangeable lens.

Focus detection positions (focus detection areas) that may be set on the photographic image plane of the interchangeable lens 202, at which an image is sampled on the photographic image plane for focus detection via focus detection pixel rows at the image sensor 212 as described later (focus detection areas, focus detection positions), are shown in FIG. 2. In this example, five focus detection areas 101 through 105 are set in a rectangular photographic image plane 100, one at the center (the position corresponding to the focus detection pixels present on the optical axis of the interchangeable lens 202), and the other four each set on an upper side, a lower side, a left side or a right side relative to the center. Focus detection pixels are arrayed side-by-side in a straight line along the longer side of each of the focus detection areas indicated as rectangular areas. The focus detection pixels in the focus detection areas 101, 102 and 103 are set side-by-side along the horizontal direction, whereas the focus detection pixels in the focus detection areas 104 and 105 are set side-by-side along the vertical direction.

Figure 3:
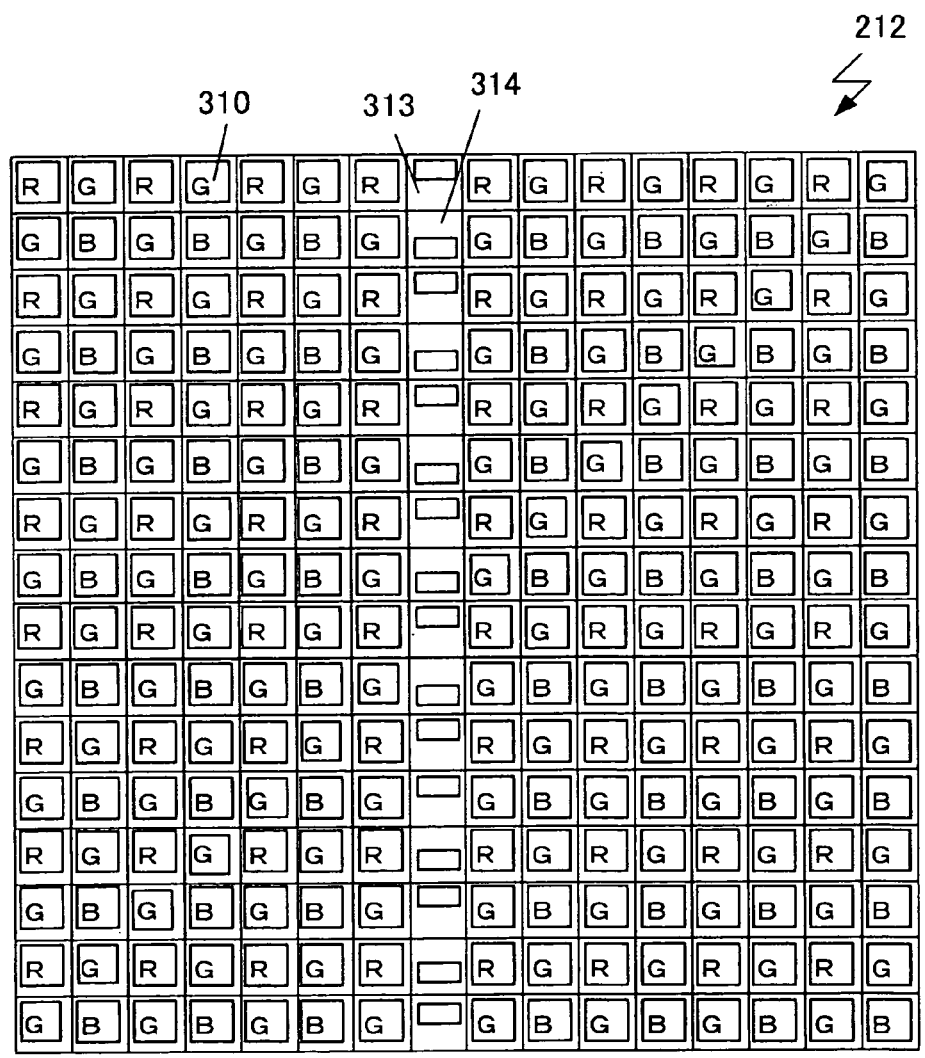
FIG. 3 is a front view showing the structure of the image sensor in detail.

FIG. 3 is a front view showing in detail the structure adopted in the image sensor 212. FIG. 3 shows in detail the pixel array pattern assumed in the image sensor in an enlarged view of an area around the focus detection area 104 or 105 in FIG. 2. The image sensor 212 includes image-capturing pixels 310 disposed in a dense two-dimensional square grid array. The image-capturing pixels 310, which include red pixels (R), green pixels (G) and blue pixels (B), are disposed in compliance with a Bayer array pattern rule. FIG. 3 shows a focus detection pixel 313 and a focus detection pixel 314 (shown in front views in the FIGS. 6A and 6B respectively) assuming a pixel size matching that of the image-capturing pixels 310 and engaged in focus detection along the vertical direction, which are disposed alternately to each other in a linear iteration along the vertical direction, so as to occupy successive positions that would be normally occupied by green pixels and red pixels.

In the horizontal focus detection pixel array pattern assumed for the focus detection pixels included in the focus detection areas 101, 102 and 103 in FIG. 2, a focus detection pixel 315 and a focus detection pixel 316 (shown in front views in the FIGS. 6C and 6D respectively), assuming a pixel size matching that of the image-capturing pixels 310 and engaged in focus detection along the horizontal direction, are disposed alternately to each other in a linear iteration along the horizontal direction, so as to occupy successive positions that would be normally occupied by green pixels and blue pixels.

Figure 4:
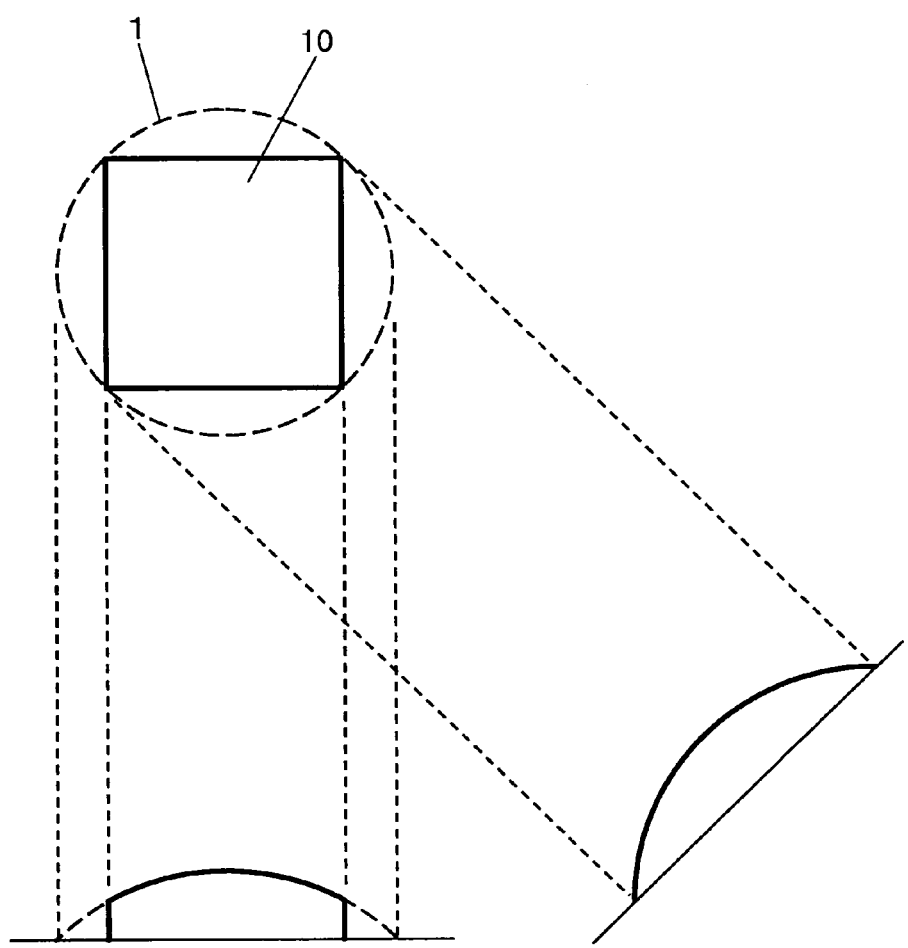
FIG. 4 shows the shape of the on-chip lens included in an image-capturing pixel or a focus detection pixel.

FIG. 4 shows the shape of the on-chip lenses 10 included in the image-capturing pixels 310 and the focus detection pixels 313, 314, 315 and 316. The on-chip lenses 10 of the image-capturing pixels 310 and the focus detection pixels 313, 314, 315 and 316 assume a shape achieved by cutting out a square-shaped lens with the size thereof matching the pixel size from a round on-chip lens 1 larger than the pixels. The shape of the section of the on-chip lens 10, taken along a diagonal passing through the optical axis, and the shape of the section of the on-chip lens 10, taken along a horizontal line passing through the optical axis, are as shown in FIG. 4.

Three types of color filters, red (R) green (G) and blue (B) color filters, are disposed at the image-capturing pixels 310. Each type of color filter assumes spectral sensitivity characteristics corresponding to one of the three colors; red, green and blue. The image-capturing pixels 310 each equipped with a color filter corresponding to a specific color are disposed in a Bayer array at the image sensor 212.

Figure 5:
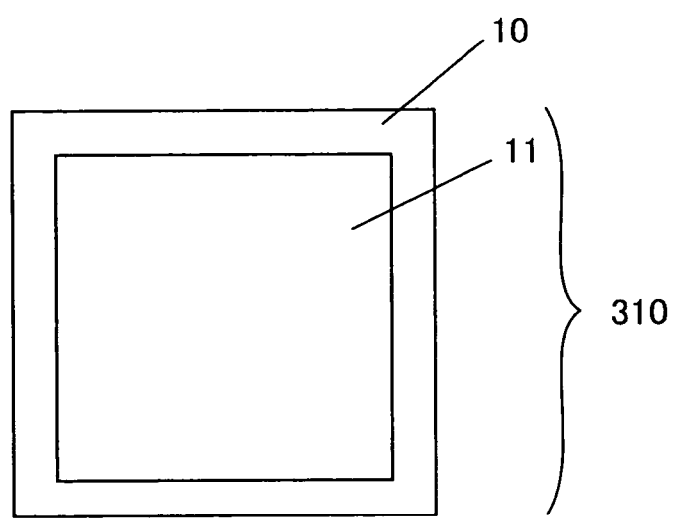
FIG. 5 is a front view of an image-capturing pixel.

FIG. 5 is a front view of an image-capturing pixel 310. As described earlier, the on-chip lens 10 assumes a square shape. An opening 11, formed on a light shielding film to be described later, defines a square light receiving area for the photoelectric conversion element.

White-color filters through which all the visible light is transmitted are disposed at the focus detection pixels 313, 314, 315 and 316 so as to enable focus detection in correspondence to all the colors. The spectral sensitivity characteristics of the white-color filters are equivalent to the sum of the spectral sensitivity characteristics of the green pixels, the red pixels and the blue pixels among the image-capturing pixels 310 described earlier. The light wavelength range corresponding to the spectral sensitivity characteristics of the white-color filters contains the individual light wavelength ranges over which the green pixels, the red pixels and the blue pixels demonstrate high spectral sensitivity characteristics.

Figure 6A:
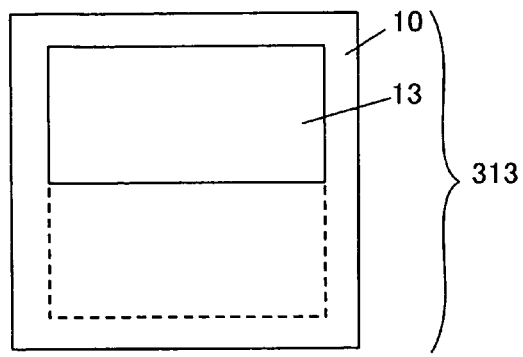
FIGS. 6A through 6D each show a focus detection pixel in a front view.

FIGS. 6A, 6B, 6C and 6D respectively present front views of a focus detection pixel 313, a focus detection pixel 314, a focus detection pixel 315 and a focus detection pixel 316. FIG. 6A shows the focus detection pixel 313 in a front view. Its on-chip lens 10 assumes a square shape. An opening 13, formed at a light shielding film to be described later, limits the light receiving area of the photoelectric conversion element to an upper half of a square (the upper half of a square split into two equal portions along a horizontal line).

Figure 6C:
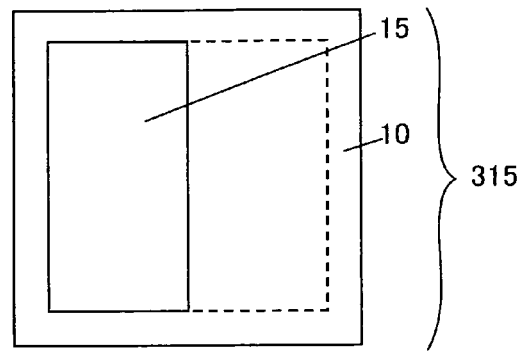
Figure 6B:
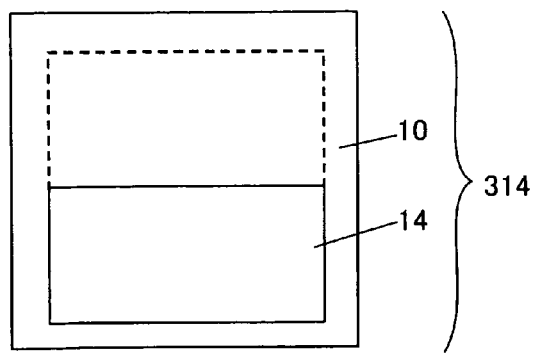

FIG. 6B shows the focus detection pixel 314 in a front view. Its on-chip lens 10 assumes a square shape. An opening 14, formed at a light shielding film to be described later, limits the light receiving area of the photoelectric conversion element to a lower half of a square (the lower half of a square split into two equal portions along a horizontal line).

When the focus detection pixel 313 and the focus detection pixel 314 are stacked one on top of the other by aligning their on-chip lenses 10, the openings 13 and 14 formed at the light shielding film are set side-by-side along the vertical direction and achieve a complementary relation to each other across a boundary set at the horizontal splitting line that splits the opening 11 at the image-capturing pixel 310 into two equal portions.

FIG. 6C shows the focus detection pixel 315 in a front view. Its on-chip lens 10 assumes a square shape. An opening 15, formed at a light shielding film to be described later, limits the light receiving area of the photoelectric conversion element to a left half of a square (the left half of a square split into two equal portions along a vertical line).

Figure 6D:
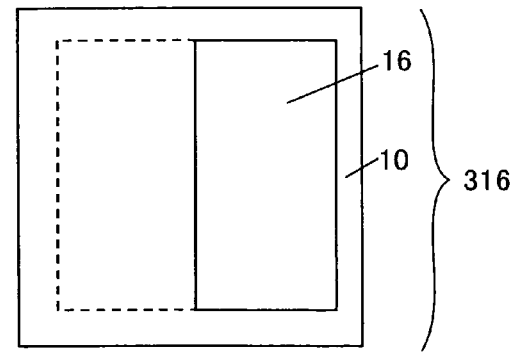

FIG. 6D shows the focus detection pixel 316 in a front view. Its on-chip lens 10 assumes a square shape. An opening 16, formed at a light shielding film to be described later, limits the light receiving area of the photoelectric conversion element to a right half of a square (the right half of a square split into two equal portions along a vertical line).

When the focus detection pixel 315 and the focus detection pixel 316 are stacked one on top of the other by aligning their on-chip lenses 10, the openings 15 and 16 formed at the light shielding film are set side-by-side along the horizontal direction and achieve a complementary relation to each other across a boundary set at the vertical splitting line that splits the opening 11 at the image-capturing pixel 310 into two equal portions.

Figure 7:
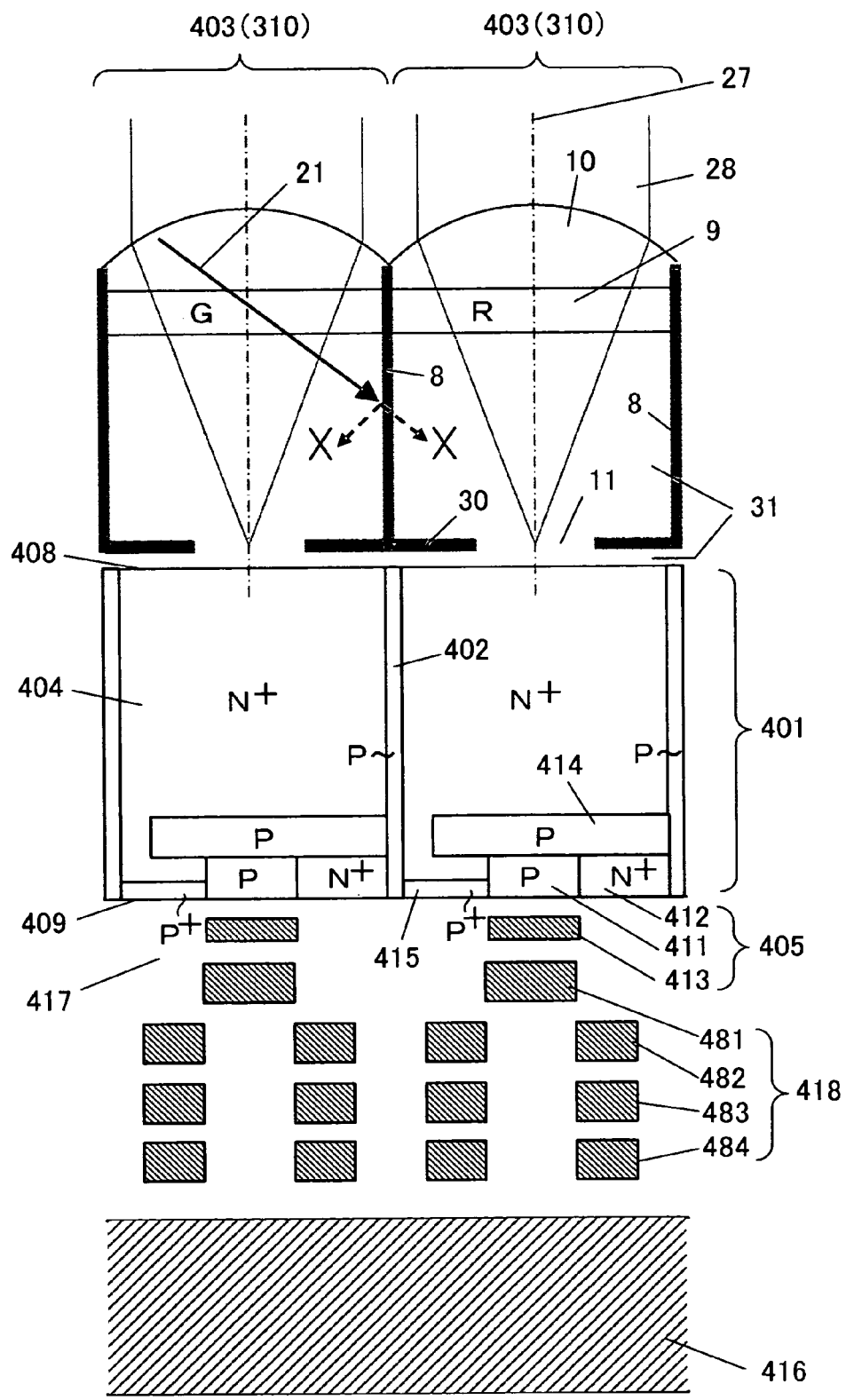
FIG. 7 is a sectional view of image-capturing pixels.

FIG. 7 is a schematic sectional view of image-capturing pixels 310 present near the optical axis at the backside illumination image sensor achieved in the embodiment of the present invention. As shown in FIG. 7, a photoelectric conversion element (photodiode) 404 constituted with a high density N-type semiconductor area is formed within each of numerous unit pixel areas 403 defined in a semiconductor substrate such as a single crystal silicon layer 401. The photoelectric conversion elements 404 in adjacent unit pixel areas 403 are separated from each other by an element separating area 402 constituted of a P-type semiconductor formed within the single crystal silicon layer 401.

A light shielding film 30 is formed on one of the principal planes of the single crystal silicon layer 401, i.e., on a back surface 408 located on the upper side in FIG. 7. Openings 11, each corresponding to one of the photoelectric conversion elements 404, are formed in the light shielding film 30, and a transparent insulating film 31 embeds each opening 11. An opening 11 in the light shielding film 30 defines the light receiving area of the photoelectric conversion element 404 corresponding to the particular opening 11. It is to be noted that FIG. 7 shows the transparent insulating film 31 also embedding the area between the light shielding film 30 and the back surface 408 of the single crystal silicon layer 401.

The light shielding film 30, constituted of a metal such as aluminum, includes an anti-reflection film vapor-deposited onto the surface thereof. The transparent insulating film 31 is laminated so as to achieve a predetermined thickness over the light shielding film 30, and a color filter 9 corresponding to the particular photoelectric conversion element 404 is formed on the insulating film 31. The transparent insulating film 31 is allowed to achieve the predetermined thickness by setting the plane at which the light shielding film 30 is disposed in a conjugate relation with the plane of the exit pupil of the image forming optical system. Color filters 9 include R-color filters (notated as "R" in the figure) through which light in the red color wavelength range is transmitted, G-color filters (notated as "G" in the figure) through which light in the green color wavelength range is transmitted and B-color filters through which light in the blue color wavelength range is transmitted. These color filters are set in a Bayer array.

The on-chip lens 10 corresponding to each photoelectric conversion element 404 is formed on a color filter 9. The position of an optical axis 27 of the on-chip lens 10 corresponding to a given photoelectric conversion element 404 matches the position of the center of the opening 11 in the light shielding film 30 corresponding to the particular photoelectric conversion element 404. It is to be noted that in an image-capturing pixel 310 located in a peripheral area of the image sensor 212, the position of the optical axis 27 of the on-chip lens 10 and the position of the center of the opening 11 in the light shielding film 30 corresponding to the photoelectric conversion element 404 in the particular image-capturing pixel are slightly shifted relative to each other so as to prevent shading that tends to occur readily in the periphery of the image plane.

In addition, a barrier 8 functioning as a light shielding member ranging along a direction parallel to the on-chip lens axis is disposed so as to extend from the light shielding film 30 to the on-chip lens 10 at the boundary between each unit pixel area 403 and an adjacent unit pixel area. The barrier 8 is constituted of aluminum, which is used as a wiring material and the like, and the surfaces of the barrier 8, i.e., the surfaces in contact with the transparent insulating films 31, are coated with an anti-reflection film such as titanium nitride vapor-deposited thereupon.

On the side of the single crystal silicon layer 401 where the other principal plane is present, i.e., on a surface 409 located on the lower side in FIG. 7, a read circuit 405 that reads out a signal corresponding to a signal charge having been accumulated at a specific photoelectric conversion element 404 is formed. An insulating layer 417 is formed on the read circuit 405, with a plurality of wiring layers 418 formed inside the insulating layer 417.

The read circuit 405 includes a readout gate portion 411 constituted with a P-type semiconductor area, a floating diffusion portion (FD portion) 412 located adjacent to the readout gate portion 411 and constituted with a high density N-type semiconductor area to which the signal charge having accumulated at the photoelectric conversion element 404 is transferred, a reset gate portion (not shown) via which the signal charge having accumulated at the FD portion 412 is cleared, a MOS circuit (not shown) connected to the FD portion 412 and constituted with a MOS transistor, which outputs the signal corresponding to the signal charge having accumulated in the FD portion 412, and a readout electrode 413 formed on the readout gate portion 411.

In addition, a second element separating area 414 constituted with a P-type semiconductor area and a positive charge accumulating area 415, located adjacent to the photoelectric conversion element 404 and constituted with a high density P-type semiconductor area formed on the side where the surface 409 of the single crystal silicon layer 401 is present, are formed in the single crystal silicon layer.

The wiring layers 418 include four layers of wirings. More specifically, the wiring layers 418 include a first-layer wiring 481, a second-layer wiring 482 formed above the first layer wiring 481 via the insulating layer 417, a third-layer wiring 483 formed above the second layer wiring 482 via the insulating layer 417 and a fourth-layer wiring 484 formed above the third layer wiring 483 via the insulating layer 417, all present within the insulating layer 417, which is formed on the single crystal silicon layer 401 on the side where the surface 409 is present. It is to be noted that a flattening film constituted with a passivation film (not shown) is formed upon the insulating layer 417, and a supporting substrate 416 is bonded onto the flattening film via an adhesive layer.

As will be explained later, the plane at which the light shielding film 30 is disposed in an image-capturing pixel 310 of the backside illumination image sensor structured as described above, is in a conjugate relation with the plane at which the exit pupil of the image forming optical system that forms an image on the image sensor is present, with regard to the on-chip lens 10. Light 28 having entered the on-chip lens 10 located on the side where the back surface 408 of the single crystal silicon layer 401 is present passes through the color filter 9 and achieves focus at the plane at which the light shielding film 30 is disposed. The light 28 restricted at the opening 11 in the light shielding film 30 is ultimately guided to the photoelectric conversion element 404. A signal charge generated and accumulated at the photoelectric conversion element 404 in correspondence to the light 28 is transferred to the FD portion 412 through the readout gate portion 411 and is accumulated in the FD portion 412 as a high voltage is applied to the readout electrode 413. A signal corresponding to the signal charge accumulated in the FD portion 412 is then output by the MOS circuit. Once the signal has been output, the signal charge having accumulated in the FD portion 412 is reset and the next exposure session starts.

Stray light 21 with a large angle of incidence is blocked by the barrier 8 and thus does not enter the adjacent unit pixel area 403. In addition, the anti-reflection film vapor-deposited on the surface of the barrier 8 prevents the stray light 21, having been blocked at the barrier 8, from being reflected off the barrier 8 and entering the opening 11 in the light shielding film 30.

The distance from the on-chip lens 10 to the light shielding film 30 in the image sensor adopting the structure described above is greater than the distance between the on-chip lens and the light shielding film in a pixel at a backside illumination image sensor in the related art. Without the barrier 8, even oblique light with a relatively small angle of incidence compared to the stray light 21 would be allowed to readily enter the adjacent unit pixel area 403. In other words, the presence of a light shielding member such as the barrier 8 is crucial. In addition, since the anti-reflection film vapor-deposited on the surface of the barrier 8 prevents entry of the stray light 21 that would otherwise be reflected off the barrier 8, pass through the opening 11 in the light shielding film 30 and enter the photoelectric conversion element 401, into the photoelectric conversion element 404, the quality of the signal is improved.

Figure 8:
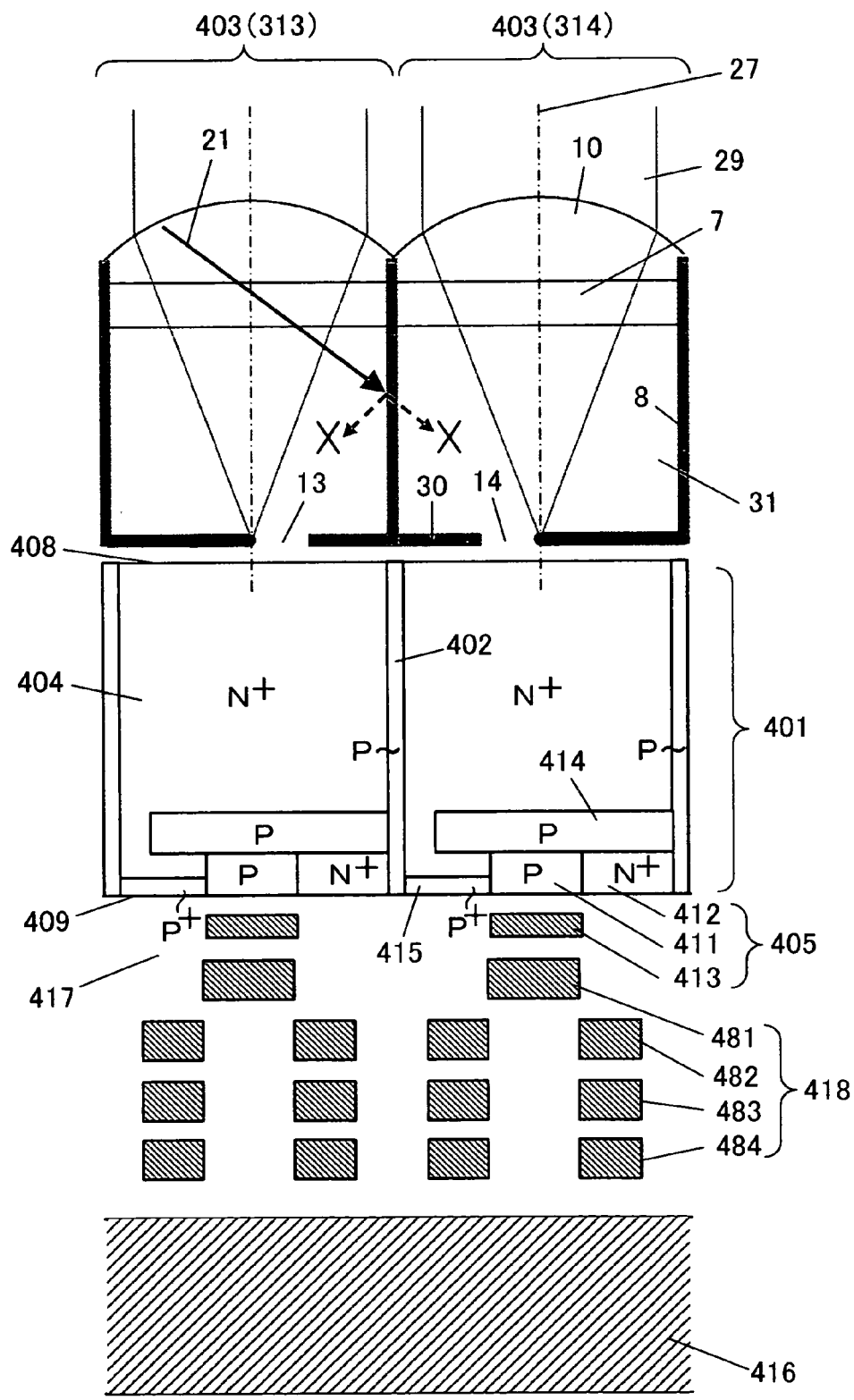
FIG. 8 is a sectional view of focus detection pixels.

FIG. 8 is a schematic sectional view of focus detection pixels 313 and 314 in the backside illumination image sensor achieved in the embodiment of the present invention. The focus detection pixels 313 and 314 in FIG. 8 differ from the image-capturing pixels 310 only in their portions above the light shielding film 30, and accordingly, the following description focuses on these portions.

A light shielding film 30 is formed on one of the principal planes of the single crystal silicon layer 401, i.e., on the back surface 408 on the upper side in FIG. 8. An opening is formed in correspondence to each photoelectric conversion element 404 in the shielding film 30. Namely, an opening 13 is formed at each focus detection pixel 313 and an opening 14 is formed at each focus detection pixel 314, with a transparent insulating film 31 embedding the openings 13 and 14. The openings 13 and 14 each assume a shape that is achieved by covering either the left half or the right half of the opening 11 at an image-capturing pixel 310. The openings 13 and 14 formed in the light shielding film 30 define the light receiving areas of the photoelectric conversion elements 404 corresponding to the openings 13 and 14. It is to be noted that FIG. 8 shows the transparent insulating film 31 also filling the area between the light shielding film 30 and the back surface 408 of the single crystal silicon layer 401.

The light shielding film 30, constituted of a metal such as aluminum, includes an anti-reflection film vapor-deposited onto the surfaces thereof. The transparent insulating film 31 is laminated so as to achieve a predetermined thickness on the light shielding film 30, and a white-color filter 7 is formed on the insulating film 31 in correspondence to each photoelectric conversion element 404. The transparent insulating film 31 is allowed to achieve the predetermined thickness by setting the plane at which the light shielding film 30 is disposed is in a conjugate relation with the plane of the exit pupil of the image forming optical system. The on-chip lens 10 corresponding to each photoelectric conversion element 404 is formed on a white-color filter 7.

In addition, a barrier 8 functioning as a light shielding member ranging along a direction parallel to the on-chip lens axis is disposed so as to extend from the light shielding film 30 to the on-chip lens 10 at the boundary between each unit pixel area 404 and an adjacent unit pixel area. The barrier 8 is constituted of aluminum, which is used as a wiring material and the like, and the surfaces of the barrier 8, i.e., the surfaces in contact with the transparent insulating films 31, are coated with an anti-reflection film such as titanium nitride vapor-deposited thereupon. Light 29 having entered the on-chip lens 10 located on the side where the back surface 408 of the single crystal silicon layer 401 is present at a focus detection pixel 313 or 314 of the backside illumination image sensor structured as described above passes through the white-color filter 7 and achieves focus at the plane at which the light shielding film 30 is disposed. The light 29 restricted at the opening 13 or 14 in the light shielding film 30 is ultimately guided to the corresponding photoelectric conversion element 404.

Stray light 21 with a large angle of incidence is blocked by the barrier 8 and thus does not enter the adjacent unit pixel area 403. In addition, the anti-reflection film vapor-deposited on the surface of the barrier 8 prevents the stray light 21, having been blocked at the barrier 8, from being reflected off the barrier 8 and entering the opening 13 or 14 in the light shielding film 30.

As will be detailed later, it is an essential structural requirement for the focus detection pixels 313 and 314 that they include complementary openings 13 and 14 formed in the light shielding film 30 and that focus be achieved via the on-chip lenses 10 on the light shielding film 30. This means that the distance from each on-chip lens 10 to the light shielding film 30 is bound to be greater than the distance between the on-chip lens and the light shielding film at a pixel in a backside illumination image sensor in the related art. Without the barrier 8, even oblique light with a relatively small angle of incidence compared to the stray light 21 would be allowed to readily enter the adjacent unit pixel area 403. In other words, the presence of a light shielding member such as the barrier 8 is crucial. In addition, since the anti-reflection film vapor-deposited on the surface of the barrier 8 prevents entry of the stray light 21 that would otherwise be reflected off the barrier wall 8, pass through the opening 13 or 14 in the light shielding film 30 and enter the photoelectric conversion element 401, into the photoelectric conversion element 404, the quality of the signal is improved and the focus detection accuracy is thus ultimately improved.

The structures of the focus detection pixels 315 and 316 are basically identical to the structures of the focus detection pixels 313 and 314 shown in FIG. 8, except for their orientations, as they are rotated by 90° relative to the focus detection pixels 313 and 314.

Figure 9:
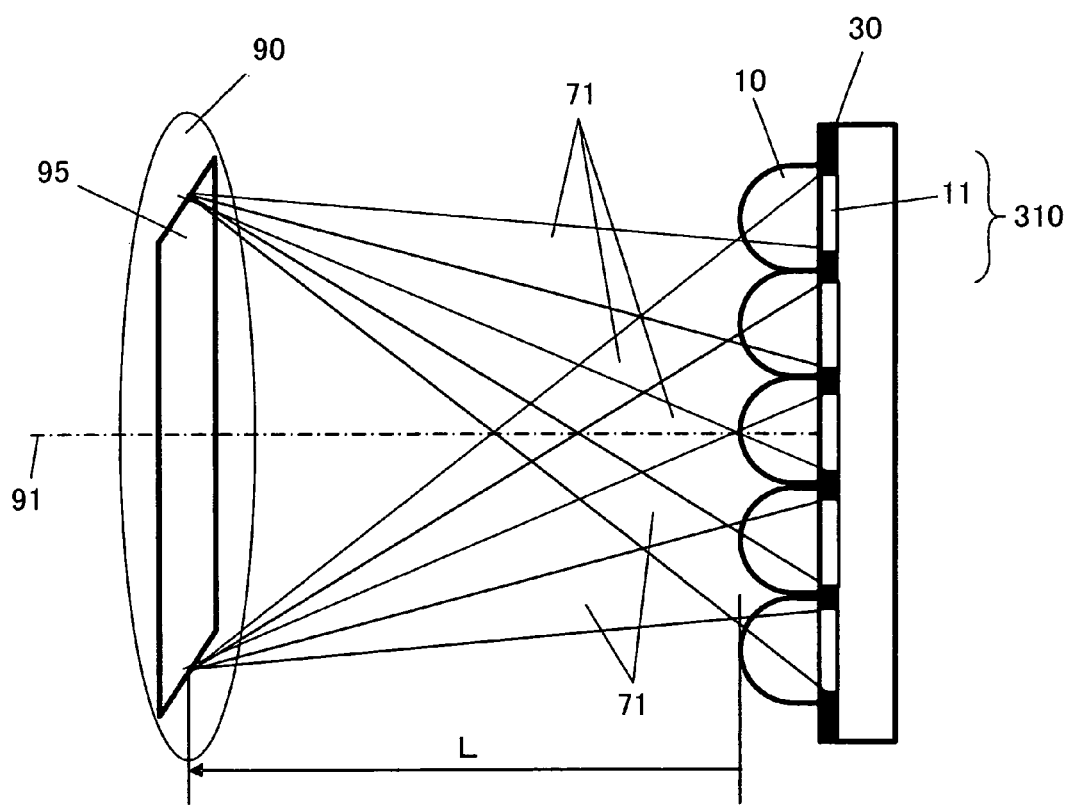
FIG. 9 illustrates the relationship between the plane at which the light shielding film at the image-capturing pixels is disposed and the plane at which the exit pupil of the image forming optical system is present.

FIG. 9 shows the relationship between the plane at which the light shielding film 30 in the image-capturing pixels 310 is disposed and the plane at which the exit pupil of the image forming optical system is present. The positions of the openings 11 formed in the light shielding film 30 in correspondence to all the image-capturing pixels 310 arrayed on the image sensor 212 each achieve a conjugate relation with the position of a common area 95 defined by all the image-capturing pixels 310 on an exit pupil plane 90, which is set apart from the on-chip lenses 10 by a pupil distance L, with regard to the on-chip lens 10 in the corresponding image-capturing pixel 310. Namely, an image forming relationship exists whereby the plane at which the light shielding film 30 is disposed is in a conjugate relation with the exit pupil plane 90 with regard to the image forming plane, i.e., the apex plane at which the apex of the on-chip lens 10 is set and a signal corresponding to the intensity of an image formed on the image forming plane is output from the corresponding image-capturing pixel 310. Under these circumstances, as the openings 11 formed in the light shielding film 30 in correspondence to the individual image-capturing pixels 310 are projected via the on-chip lenses 10 onto the exit pupil plane 10, the projection image of the opening 11 of each image-capturing pixel 310 invariably defines the area 95.

Accordingly, each image-capturing pixel 310 receives a light flux 71 having passed through the area 95 and the on-chip lens 10 at the particular image-capturing pixel 310, and then outputs a signal corresponding to the intensity of the image formed with the light flux 71 on the on-chip lens 10.

It is to be noted that the positional relationship between the position of the optical axis of the on-chip lens 10 and the center of the opening 11 is shifted for each image-capturing pixel 310 in correspondence to the image height of the particular image-capturing pixel 310, so as to ensure that the light flux 71 having passed through the common area 95 shared by all the image-capturing pixels, defined on the exit pupil plane 90, is received at the image-capturing pixel 310 regardless of its image height.

As described above, since the plane at which the light shielding film 30 is disposed is in a conjugate relation with the exit pupil plane 90, the image-capturing pixels 310 are each allowed to receive light in an amount in proportion to the area of the aperture opening on the exit pupil plane 90 and thus, better linearity is assured in the exposure control.

While the position of the exit pupil plane 90 varies among different interchangeable lenses 202 used in an interchangeable lens system, the pupil distance L may, in practice, be set based upon the average exit pupil plane position assumed in the interchangeable lens system.

Figure 10:
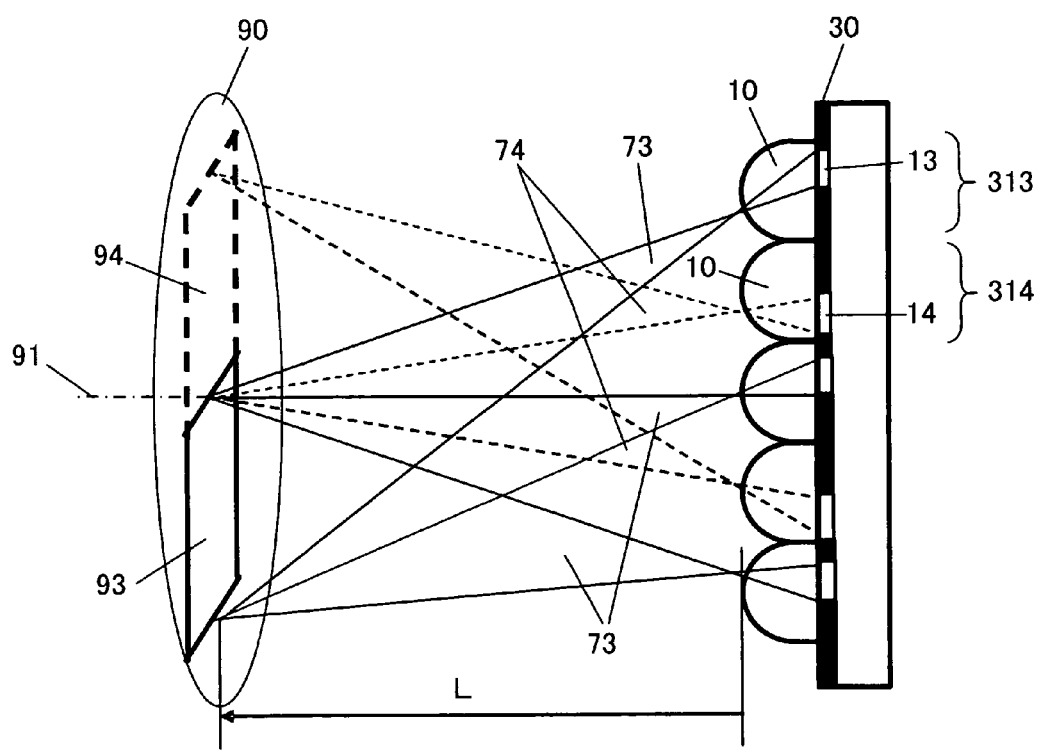
FIG. 10 illustrates the relationship between the plane at which the light shielding film the focus detection pixels is disposed and the plane at which the exit pupil of the image forming optical system is present.

FIG. 10 shows the relationship between the plane at which the light shielding film 30 at the focus detection pixels 313 and 314 is disposed and the plane at which the exit pupil of the image forming optical system is present.

The positions of the openings 13 formed in the light shielding film 30 in correspondence to all the focus detection pixels 313 arrayed on the image sensor 212 each achieve a conjugate relation with the position of a common area 93 defined by all the focus detection pixels on the exit pupil plane 90, which is set apart from the on-chip lenses 10 by the pupil distance L, with regard to the on-chip lens 10 in the corresponding focus detection pixel 313. Namely, an image forming relationship exists whereby the plane at which the light shielding film 30 is disposed is in a conjugate relation with the exit pupil plane 90 with regard to the image forming plane, i.e., the apex plane at which the apex of the on-chip lens 10 is set and a signal corresponding to the intensity of an image formed on the image forming plane is output from the corresponding focus detection pixel 313. Under these circumstances, as the openings 13 formed in the light shielding film 30 in correspondence to the individual focus detection pixels 313 are projected via the on-chip lenses 10 onto the exit pupil plane 10, the projection image of the opening 13 of each focus detection pixel 313 invariably defines the area 93.

In addition, the positions of the openings 14 formed in the light shielding film 30 in correspondence to all the focus detection pixels 314 arrayed on the image sensor 212 each achieve a conjugate relation with the position of a common area 94 defined by all the focus detection pixels on an exit pupil plane 90, which is set apart from the on-chip lenses 10 by the pupil distance L, with regard to the on-chip lens 10 in the corresponding focus detection pixel 314. Namely, an image forming relationship exists whereby the plane at which the light shielding film 30 is disposed is in a conjugate relation with the exit pupil plane 90 with regard to the image forming plane, i.e., the apex plane at which the apex of the on-chip lens 10 is set and a signal corresponding to the intensity of an image formed on the image forming plane is output from the corresponding focus detection pixel 314. Under these circumstances, as the openings 14 formed in the light shielding film 30 in correspondence to the individual focus detection pixels 314 are projected via the on-chip lenses 10 onto the exit pupil plane 10, the projection image of the opening 14 of each focus detection pixel 314 invariably defines the area 94.

In the description given in reference to FIG. 10, the pair of areas 93 and 94 are referred to as a pair of focus detection pupils 93 and 94. Each focus detection pixel 313 receives a light flux 73 having passed through the focus detection pupil 93 and the on-chip lens 10 at the particular focus detection pixel 313 and outputs a signal corresponding to the intensity of the image formed with the light flux 73 on the on-chip lens 10. Each focus detection pixel 314 receives a light flux 74 having passed through the focus detection pupil 94 and the on-chip lens 10 at the particular focus detection pixel 314 and outputs a signal corresponding to the intensity of the image formed with the light flux 74 on the on-chip lens 10.

A combined area made up with the focus detection pupils 93 and 94 on the exit pupil 90, through which the light fluxes 73 and 74 to be received at each pair of focus detection pixels 313 and 314 pass, matches the area 95 on the exit pupil 90, through which the light fluxes 71 to be received at the image-capturing pixels 310 pass. The light fluxes 73 and 74 assume a complementary relationship to each other on the exit pupil 90 in relation to the light fluxes 71.

Numerous focus detection pixels 313 and 314 structured as described above, are disposed so that a focus detection pixel 313 and a focus detection pixel 314 paired up with the focus detection pixel 313 are arrayed alternately to each other in a linear iteration. By integrating the outputs from the photoelectric conversion elements 404 of the individual focus detection pixels 313 and 314 into a pair of output groups, one corresponding to the focus detection pupil 93 and the other corresponding to the focus detection pupil 94, information pertaining to the intensity distributions of the pairs of images formed on the focus detection pixel row (extending along the vertical direction) by the pairs of light fluxes passing through the focus detection pupil 93 and the focus detection pupil 94 is obtained. Then, image shift detection operation processing (correlation calculation processing, phase difference detection processing) of the known art is executed in conjunction with this information, so as to detect an image shift amount indicating the extent of image shift manifested by the image pairs through a method often referred to as the split pupil phase detection method. Then, the image shift amount undergoes conversion calculation executed in correspondence to a proportional relation of the distance between the gravitational centers of the pair of focus detection pupils to the focus detection pupil distance, so as to determine the extent of deviation (defocus amount) of the actual image forming plane relative to the predetermined image forming plane at the focus detection position (along the vertical direction).

The focus detection light fluxes received at each pair of focus detection pixels 315 and 316 are basically identical to the light fluxes shown in FIG. 10 except for their orientations, which are rotated by 90° relative to the orientations of the pair of focus detection pixels 73 and 74 received at the corresponding focus detection pixels 313 and 314. A pair of focus detection pupils, rotated by 90° relative to the focus detection pixels 93 and 94, is set in correspondence to the pairs of focus detection pixels 315 and 316. Numerous focus detection pixels 315 and 316, are disposed so that a focus detection pixel 315 and a focus detection pixel 316 paired up with the focus detection pixel 315 are arrayed alternately to each other in a linear iteration. By integrating the outputs from the photoelectric conversion elements 404 of the individual focus detection pixels 315 and 316 into a pair of output groups, each corresponding to one of the focus detection pupils paired up with each other, information pertaining to the intensity distributions of the pairs of images formed on the focus detection pixel row (extending along the horizontal direction) by the pairs of light fluxes passing through the pair of focus detection pupils is obtained. The extent of deviation (defocus amount) of the actual image forming plane relative to the predetermined image forming plane at the focus detection position (along the horizontal direction) can be calculated based upon the information thus obtained.

Figure 11:
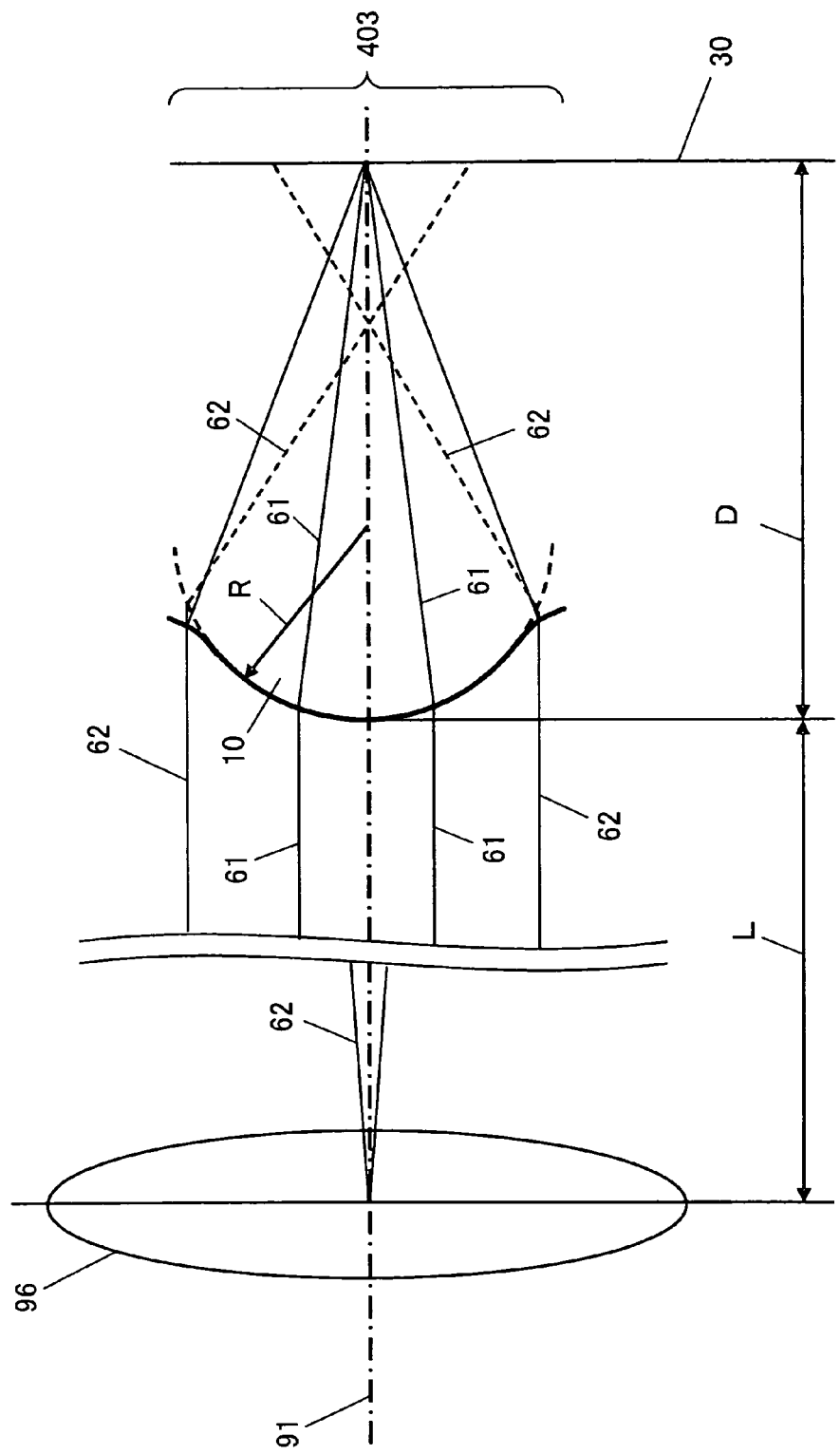
FIG. 11 is a diagram that facilitates observation of the optical requirements which must be met to allow the light shielding film plane and the exit pupil plane to be conjugate with each other.

FIG. 11 facilitates observation of the optical requirements that must be fulfilled to allow the plane at which the light shielding film 30 is disposed and the exit pupil plane 90 to achieve a conjugate relation with each other with a simplified illustration of the optical system in a unit pixel area 403 where an image-capturing pixel or a focus detection pixel is formed.

It is desirable, under normal circumstances, to achieve a sound conjugate relation by using non-spherical on-chip lenses 10. The following description, given by assuming that the on-chip lenses disposed in the image sensor, which are extremely small, assume a spherical lens contour with a constant radius of curvature, can also be applied to non-spherical on-chip lenses 10 through optimal approximation.

R represents the radius of curvature of an on-chip lens 10, L represents the distance between the apex T of the on-chip lens 10 to the exit pupil plane 90, D represents the distance from the apex T of the on-chip lens 10 to the plane at which the light shielding film 30 is disposed, n0 represents the average refractive index of the medium present between the on-chip lens 10 and the exit pupil plane 90, and n represents the average refractive index for the on-chip lens 10 and the medium present between the on-chip lens 10 and the light shielding film 30.

A condition expression defining requirements for allowing the plane at which the light shielding film 30 is disposed and the exit pupil plane 90 to achieve a conjugate relation with regard to the on-chip lens 10 is determined. The condition defined in (1) below must be satisfied for the distance D between the apex T of the on-chip lens 10 and the plane at which the light shielding film 30 is disposed, determined through approximation; distance L>>distance D, based upon a geometric-optics paraxial imaging condition.

$$D = R \cdot n/(n-n0) \tag{1}$$

Expression (2) below is obtained by assuming that the medium present between the on-chip lens 10 and the exit pupil plane 90 is air, i.e., refractive index n0=1, in a further approximation.

$$D = R \cdot n/(n-1) \tag{2}$$

The condition as defined in (3) is ascertained by modifying expression (2) on the premise that the radius of curvature R is greater than half the size of the unit pixel area 403, i.e., half the pixel pitch P. The premise that the radius of curvature R is greater than half the pixel pitch P is set forth so as to increase the light receiving efficiency by eliminating any dead zone in the photoelectric conversion element 404 where no light is received. It is to be noted that the curvature at the periphery of the on-chip lens 10 should be set more gradual compared to the curvature at the center of the on-chip lens 10 in consideration of spherical aberration, as will be described later.

$$D > P \cdot n / (2 \cdot (n-1)) \quad (3)$$

In addition, while the on-chip lens 10 assumes a spherical contour, focus is achieved with a light beam 62 passing through the periphery of the on-chip lens 10 at a position closer to the on-chip lens 10 due to the spherical aberration, relative to the focusing position achieved with a light beam 61 passing through an area near the center of the on-chip lens 10. Accordingly, the radius of curvature of the on-chip lens 10 is adjusted for purposes of spherical aberration correction so that it gradually increases with the extent of the increase becoming greater further toward the periphery of the on-chip lens 10 relative to the radius of curvature assumed at the center of the on-chip lens 10. Through these measures, the conjugate relation between the plane at which the light shielding film 30 is disposed and the exit pupil plane 90 is sustained more rigorously, which, in turn, makes it possible to improve the focus detection accuracy and improve the linearity of the exposure control.

Figure 12:
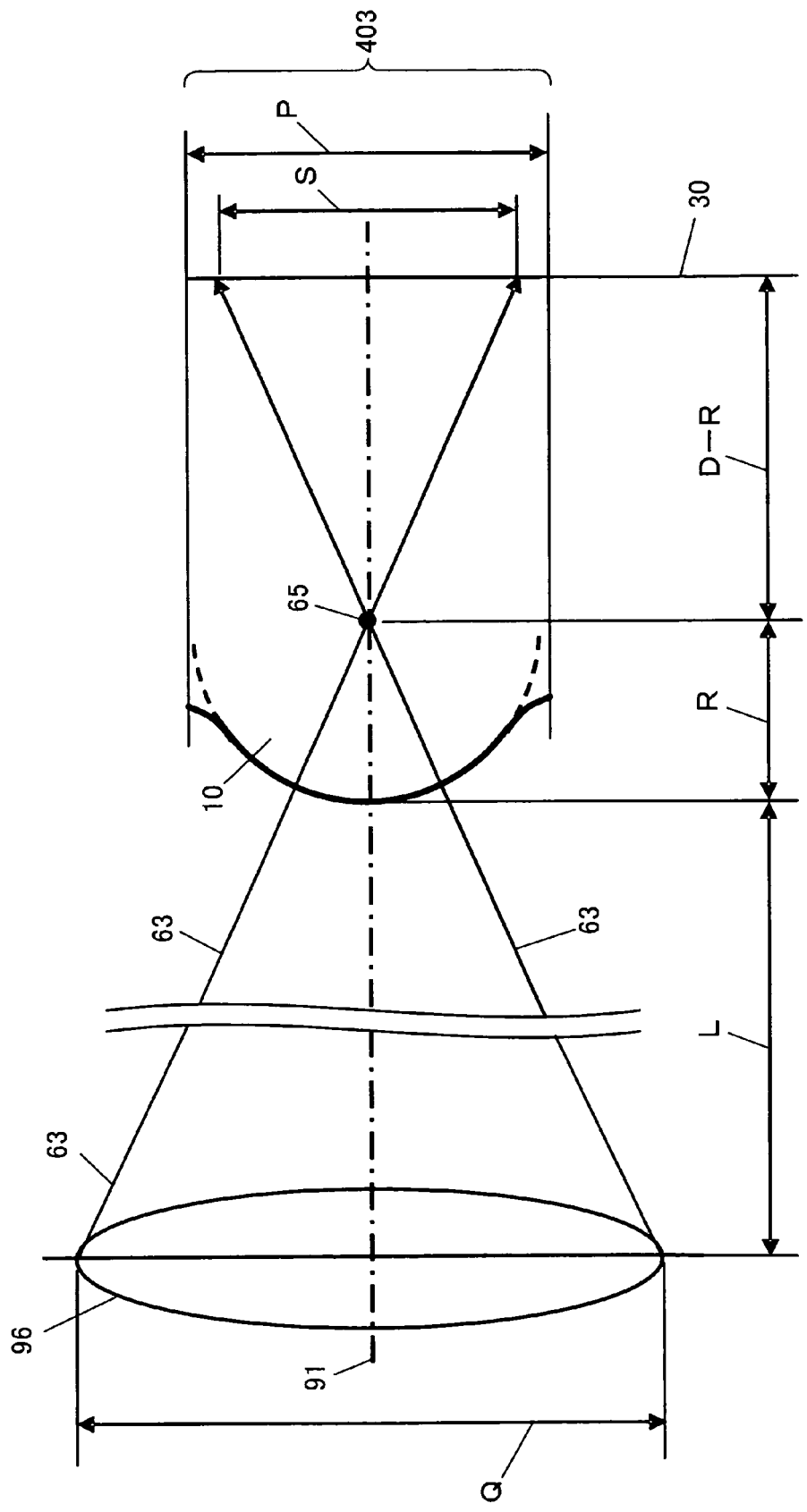
FIG. 12 is a diagram that facilitates observation of the size of an image of an aperture opening located at the exit pupil plane, which is formed on the light shielding film plane.

FIG. 12 indicates the size of the image of an aperture opening 96 set on the exit pupil plane 90, which is formed on the plane at which the light shielding film 30 is disposed. When the on-chip lens 10 assumes a spherical lens contour with the radius of curvature R, a light beam 63 having exited an edge of the aperture opening 96 to travel toward the curvature center 65 of the sphere with the radius of curvature R does not become refracted at the center of the spherical surface of the lens with the radius of curvature R. By geometrically graphing the light beam 63 traveling from the edge of the aperture opening 96 with a diameter Q toward the curvature center 65, a diameter S of the image of the aperture opening 96 formed on the plane at which the light shielding film 30 is disposed can be determined as expressed in (4) below.

$$S = (Q \cdot (D-R)) / (L+R) \quad (4)$$

Expression (4) can be modified to expression (5) below with F representing the F number of the aperture opening, which is expressed as F=L/Q, through an approximation expressed as; distance L>>radius of curvature R.

$$S = (D-R)/F \quad (5)$$

It is assumed that P represents the pixel pitch and that the smallest F number that is valid in the interchangeable lens system is the brightest F number, i.e., F0. As long as the light beam having entered the unit pixel area does not enter an adjacent unit pixel area (as long as P is greater than S), the relationship expressed in expression (6) below, obtained by using expression (2) for substitution with regard to the radius of curvature R and simplifying the resulting expression for D, exists.

$$D < F0 \cdot P \cdot n \quad (6)$$

Accordingly, the distance D from the apex T of the on-chip lens 10 to the plane at which the light shielding film 30 is disposed must be determined so as to satisfy the relationships defined in expressions (3) and (6). For instance, the average refractive index n for the on-chip lens 10 and the medium present between the on-chip lens 10 and the light shielding film 30, the pixel pitch P and the smallest F number F0 may be respectively 1.5, 4 μm and 1.4. In this situation, as long as the distance D from the apex T of the on-chip lens 10 to the plane at which the light shielding film 30 is disposed is set within a range of 6 μm to 8.4 μm, a robust conjugate relation between the exit pupil plane 90 and the plane at which the light shielding film 30 is disposed is assured and entry of stray light into the adjacent pixels can be effectively prevented.

Expressions (1) through (6) can be used even when a plurality of different types of media with varying refractive indices are present between the on-chip lens 10 and the light shielding film 30. Namely, under such circumstances, expressions (1) through (6) can be used by assuming an average refractive index for the on-chip lens 10 and the media present between the on-chip lens 10 and the light shielding film 30. In addition, expressions (1) through (6) can be used even when the on-chip lens 10 is constituted with a plurality of lenses, e.g., even when an inner lens is added, by approximating the lens function as that of a single lens.

Figure 13:
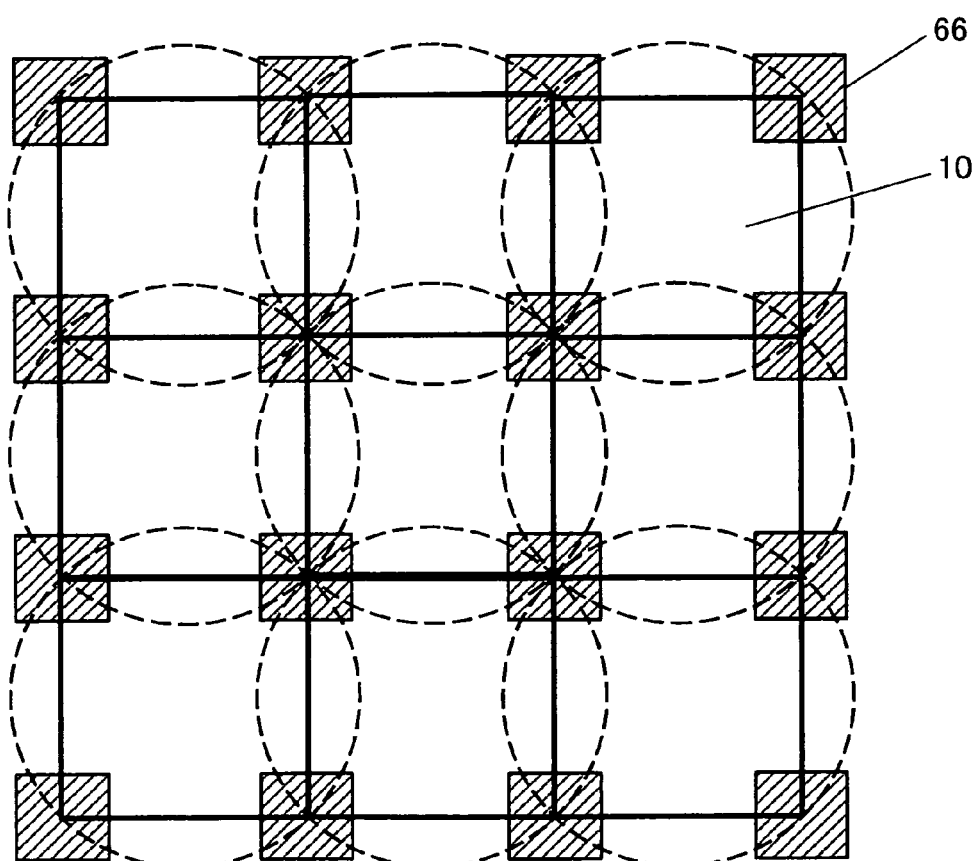
FIG. 13 shows light shielding members 66 disposed at the four corners of each on-chip lens so as to block stray light.

As described earlier, while the curvature is set more gradual at the periphery of the on-chip lens 10, stray light attributable to multiple reflection, which tends to occur readily at the four corners of the pixel located at the ends of the diagonals where the lens surface slopes more acutely. FIG. 13 shows light shielding members 66 disposed at the four corners of each on-chip lens in order to prevent such stray light. The light shielding members 66 may be light absorbing members filling the valleys in the on-chip lens array made up with the plurality of on-chip lenses 10, or they may be light absorbing members disposed at positions corresponding to those of the color filters 9 in FIG. 7 and the white-color filters 7 in FIG. 8. The light absorbing members may be constituted with, for instance, black-color filters.

In the embodiment described above, a plane conjugate with the exit pupil plane 90 of the image forming optical system, relative to the on-chip lens 10, can be set further frontward relative to the photoelectric conversion element 404 and light entering the photoelectric conversion element 404 is restricted at the opening 11, 13 or 14 located at the conjugate plane. As a result, the linear relationship between the aperture F number and the signal level can be kept intact with ease and unnecessary entry of oblique light into an adjacent pixel can also be prevented with ease.

The structure adopted in a backside illumination image sensor in the related art, in which the plane conjugate with the pupil is set within the photoelectric conversion elements, is not compatible with focus detection pixels engaged in focus detection through the split pupil phase detection method, since openings for splitting the pupil cannot be formed at the plane. In contrast, according to the present invention described above in reference to the embodiment, the plane conjugate with the exit pupil plane 90 of the image forming optical system relative to the on-chip lenses 10 can be positioned further frontward relative to the photoelectric conversion elements 404, which makes it possible to form the openings 11, 13 and 14 for splitting the pupil at the conjugate plane. Furthermore, by setting the distance D between the on-chip lenses 10 and the light shielding film 30 so as to satisfy specific requirements, focus detection pixels to be engaged in focus detection through the split pupil phase detection method, which are compatible with a backside illumination image sensor, and also assure a high level of accuracy, can be achieved while, at the same time, minimizing the adverse effects of stray light.

Other Embodiments of the Invention (1) Embodiment in which Entry of Light into Adjacent Pixels is Prevented Via Polarizers FIGS. 7 and 8 show the barriers 8, each disposed at the boundary of a unit pixel area 403 to function as a light shielding member ranging along the direction parallel to the on-chip lens axis and extending from the light shielding film 30 to the on-chip lens 10. The entry of light into adjacent unit pixel areas 403 may be prevented by adopting alternative measures.

Figure 14:
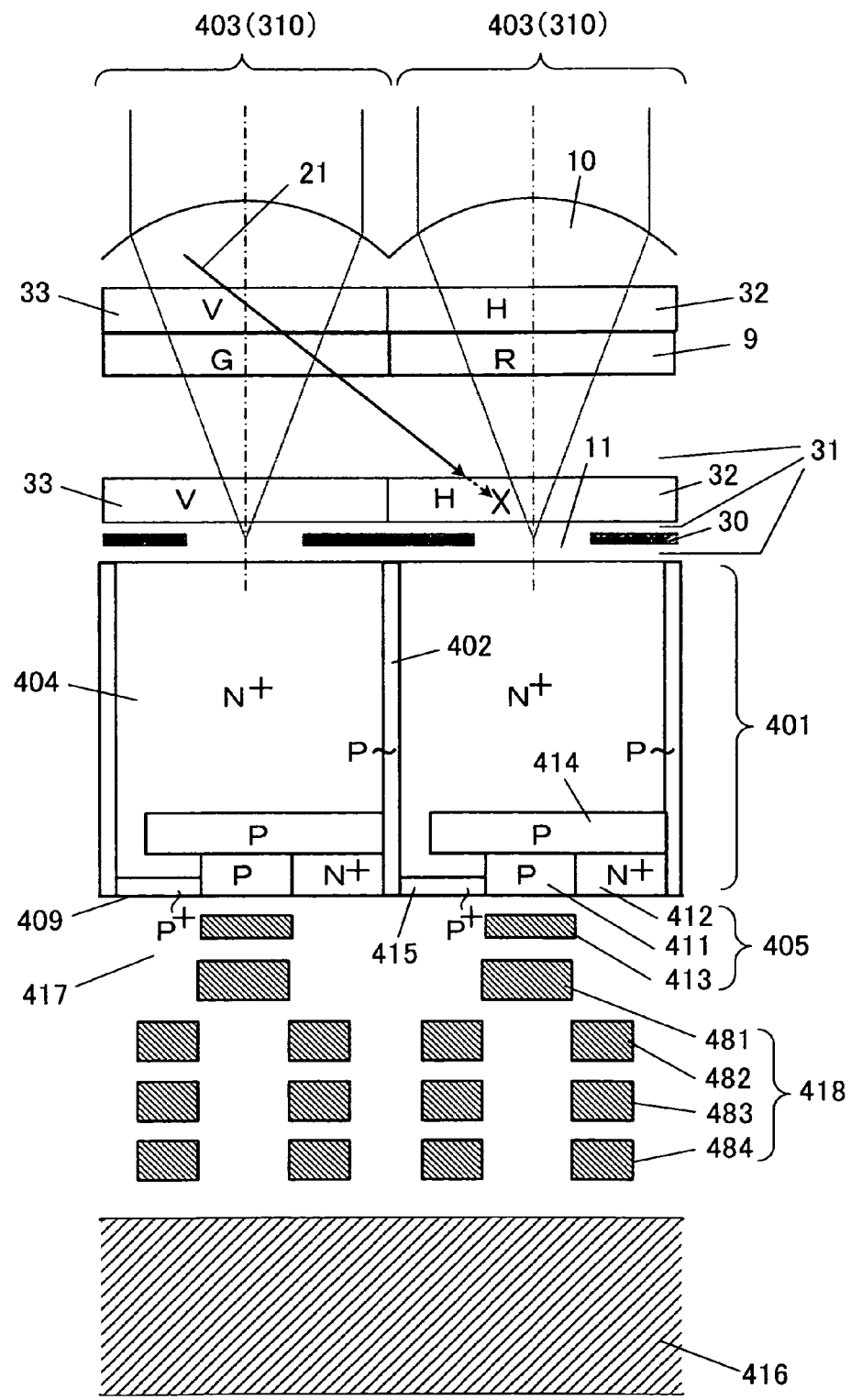
FIG. 14 is a sectional view of image-capturing pixels.
Figure 15:
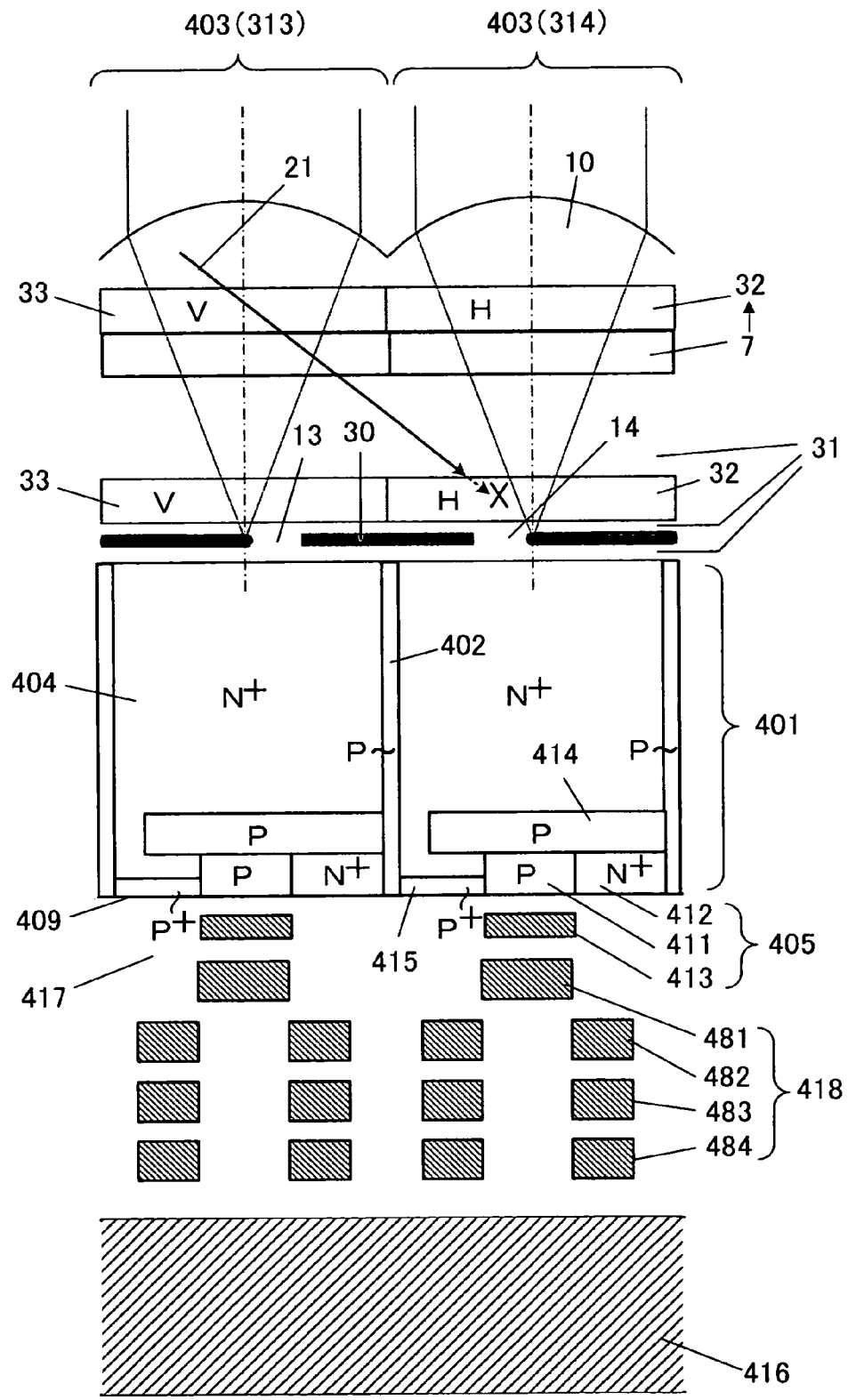
FIG. 15 is a sectional view of focus detection pixels.
Figure 16:
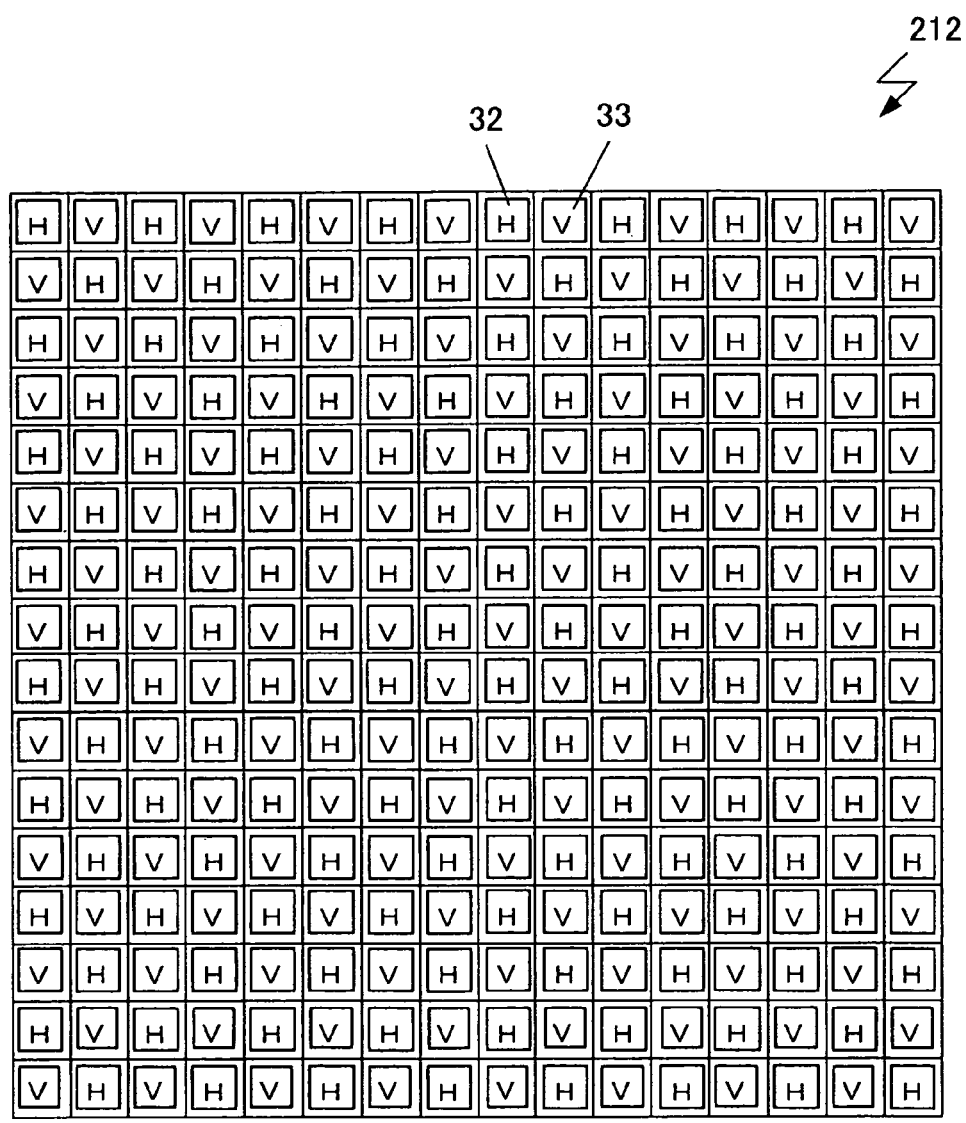
FIG. 16 illustrates the two-dimensional positional relationship between the polarizers H and the polarizers V.

FIGS. 14 through 16 present an example of light shielding measures taken by utilizing polarizers. FIG. 14 is a schematic sectional view of image-capturing pixels 310 disposed near the optical axis of the image forming optical system in a backside illumination image sensor achieved in the embodiment, in which the entry of light into adjacent pixels is prevented by polarizers. Since the structural elements disposed at positions lower than the light shielding film 30 among the structural elements in FIG. 14 are identical to those in FIG. 7, their explanation is not provided. Polarizers H32 and polarizers V33, to function as light shielding members, are disposed at the image-capturing pixels 310 shown in FIG. 14, in place of the barriers 8 shown in FIG. 7. A transparent insulating film 31 embeds the polarizers H32 and V33 located directly above the light shielding film 30 and the color filters 9. In addition, the transparent insulating film 31 also embeds the space between the light shielding film 30 and the polarizers H32 and V33 and the space between the light shielding film 30 and the back surface 408 of the single crystal silicon layer 401.

The polarizers H32 and the polarizers V33, which may be, for instance, photonic crystal polarizers configured in an array such as those disclosed in International Publication No. 2004/008196, polarize light along polarizing directions perpendicular to each other. The polarizers H32 and V33 are formed on a substrate with cyclical columns of minute grooves formed thereupon by alternately laminating a material with a high refractive index such as Si or Ta and a material with a low refractive index such as $SiO_2$ over multiple layers upon the substrate, with a reiterating pattern of indentations/projections formed in each layer.

FIG. 14 shows two polarizers H32, one disposed between the on-chip lens 10 of the right-hand side image-capturing pixel 310 and the corresponding color filter 9 and the other disposed at a position directly in front of the light shielding film 30. It also shows two polarizers V33, one disposed between the on-chip lens 10 of the left-hand side image-capturing pixel 310 and the corresponding color filter 9 and the other disposed at a position directly in front of the light shielding film 30.

Stray light 21 with a large angle of incidence will have to pass through one polarizer V33 and one polarizer H32 assuming polarizing directions perpendicular to each other before it ever reaches the opening 11 of the adjacent unit pixel area 403. Since the entry of the stray light 21 into the opening 11 in the adjacent unit pixel area 403 is thus prevented, color mixture (crosstalk) does not occur. As a result, an image of high quality can be generated.

FIG. 15 is a schematic sectional view of focus detection pixels 313 and 314 disposed near the optical axis of the image forming optical system in the backside illumination image sensor achieved in the embodiment, in which the entry of light into adjacent pixels is prevented by polarizers. Since the structural elements disposed at positions in the area lower than the light shielding film 30 among the structural elements in FIG. 15 are identical to those in FIG. 7, their explanation is not provided. Polarizers H32 and polarizers V33, to function as light shielding members, are disposed at the focus detection pixels 313 and 314 shown in FIG. 15, in place of the barriers 8 shown in FIG. 8. A transparent insulating film 31 embeds the polarizers H32 and V33 located directly above the light shielding film 30 and the white-color filters 7. In addition, the transparent insulating film 31 also embeds the space between the light shielding film 30 and the polarizers H32 and V33 and the space between the light shielding film 30 and the back surface 408 of the single crystal silicon layer 401.

FIG. 15 shows two polarizers H32, one disposed between the on-chip lens 10 of the focus detection pixel 314 and the white-color filter 7 and the other disposed at a position directly in front of the light shielding film 30. It also shows two polarizers V33, one disposed between the on-chip lens 10 of the focus detection pixel 313 and the white-color filter 7 and the other disposed at a position directly in front of the light shielding film 30.

Stray light 21 with a large angle of incidence will have to pass through one polarizer V33 and one polarizer H32 assuming polarizing directions perpendicular to each other before it ever reaches the opening 13 or 14 of the adjacent unit pixel area 403. Since the entry of the stray light 21 into the opening 13 or 14 in the adjacent unit pixel area 403 is thus prevented, color mixture (crosstalk) does not occur. As a result, highly accurate focus detection can be achieved.

The structures of the focus detection pixels 315 and 316 are basically identical to the structures of the focus detection pixels 313 and 314 shown in FIG. 15, except for their orientations, since they are rotated by 90° relative to the focus detection pixels 313 and 314.

FIG. 16, which corresponds to FIG. 3, indicates the two-dimensional positional relationship among the polarizers H32 and the polarizers V33 shown in FIGS. 14 and 15. With the polarizers H32 and the polarizers V33 disposed in an alternate checkered pattern, entry of stray light from pixels located above, below, to the left and to the right can be effectively prevented.

FIGS. 14 and 15 show that each unit pixel area 403 includes polarizers disposed at two positions therein. As a structural alternative, the space between the color filter 9 or the white-color filter 7 and the light shielding film 30, filled with the transparent insulating film 31 in the example presented in FIGS. 14 and 15, may instead be entirely taken up by the polarizer which is disposed at the position immediately in front of the light shielding film 30 in the example presented in FIGS. 14 and 15. Similar advantages are achieved by adopting the alternative structure as well.

(2) Embodiment with a Pair of Light Receiving Areas Formed in Each Focus Detection Pixel In the image sensor 212 shown in a partial enlargement in FIG. 3, focus detection pixels 313 and 314, each equipped with a single photoelectric conversion element, are disposed so that each focus detection pixel 313 is paired up with an adjacent focus detection pixel 314. However, the present invention may be adopted in conjunction with focus detection pixels each equipped with a pair of photoelectric conversion elements, such as focus detection pixels 311 and 312 shown in front views in FIGS. 17A and 17B.

Figure 17A:
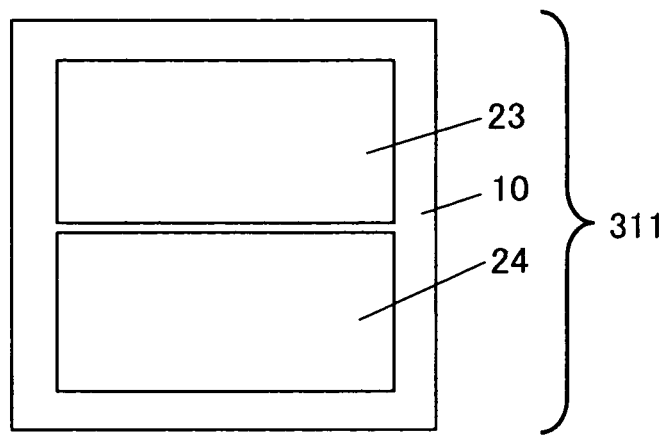
FIGS. 17A and 17B each show a focus detection pixel in a front view.
Figure 17B:
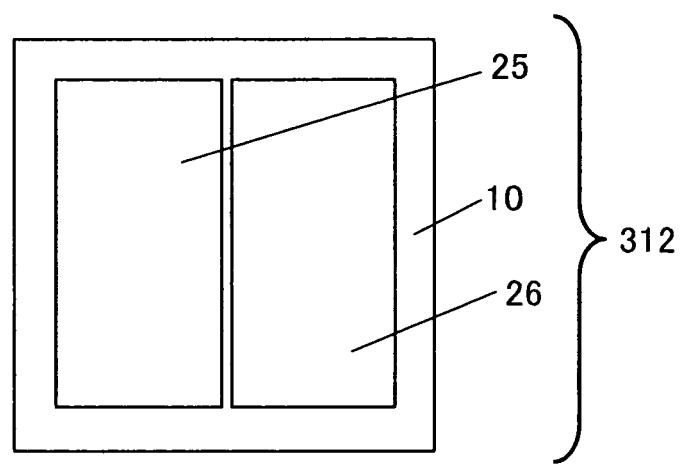

The focus detection pixel 311 shown in FIG. 17A fulfills the functions achieved by the pair of focus detection pixels 313 and 314 respectively shown in FIGS. 6A and 6B, whereas the focus detection pixel 312 shown in FIG. 17B fulfills the functions achieved by the pair of focus detection pixels 315 and 316 respectively shown in FIGS. 6C and 6D. The focus detection pixel 311 in FIG. 17A includes an on-chip lens 10 and a pair of light receiving areas 23 and 24, whereas the focus detection pixel 312 in FIG. 17B includes an on-chip lens 10 and a pair of light receiving areas 25 and 26.

Figure 18:
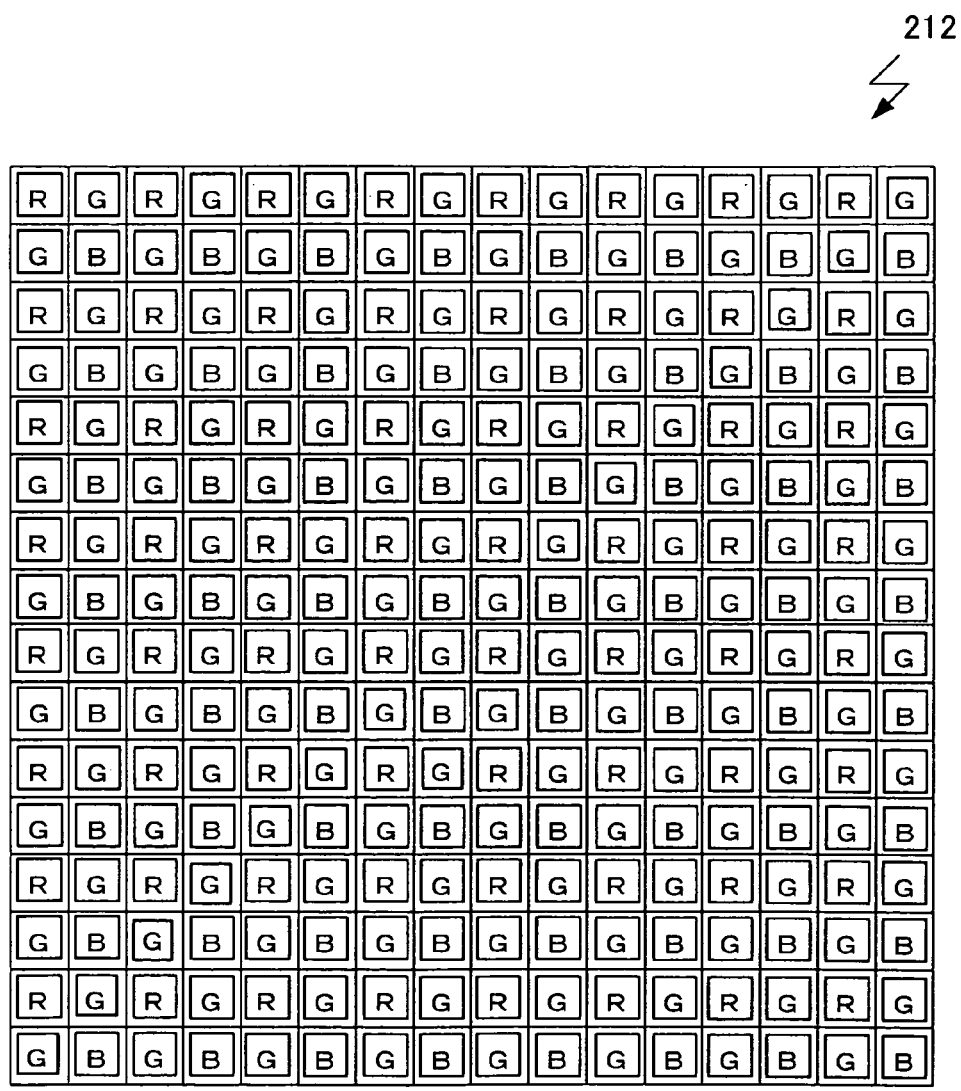
FIG. 18 illustrates the two-dimensional positional relationship among the color filters.

FIG. 18 shows the two-dimensional positional relationship among the color filters in an image sensor distinguishable from that shown in FIG. 3 in that focus detection pixels 311 are disposed in place of the focus detection pixels 313 and 314. FIG. 18 indicates that the focus detection pixels 311 or 312, too, include color filters disposed in the color filter array pattern matching that of the image-capturing pixels 310. The two-dimensional positional relationship among the color filters shown in FIG. 18 is also assumed in an area of the image sensor where focus detection pixels 312 are disposed in place of the focus detection pixels 315 and 316.

Figure 19:
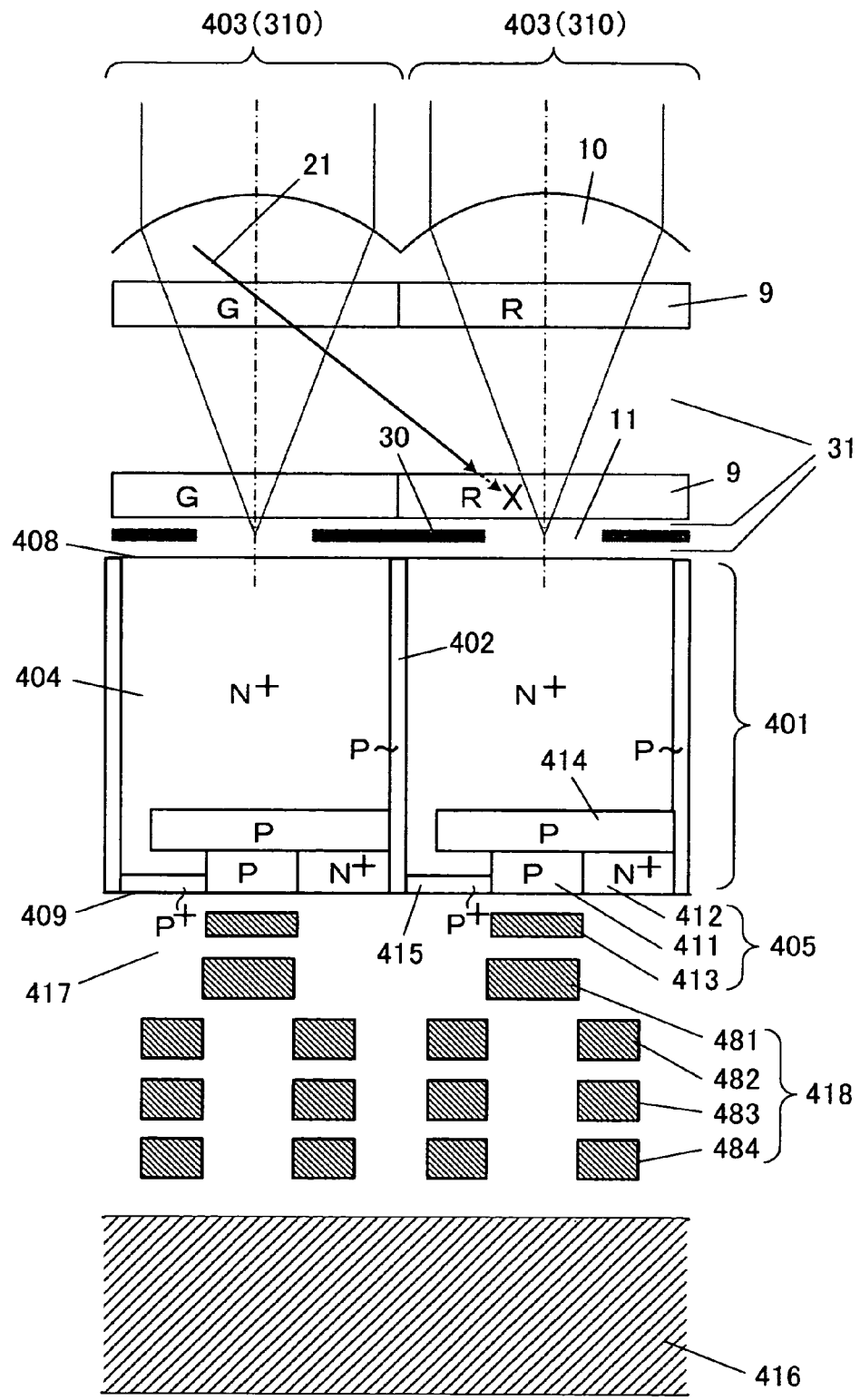
FIG. 19 is a sectional view of image-capturing pixels.

FIG. 19 is a schematic sectional view of image-capturing pixels 310 disposed near the optical axis of the image forming optical system in the backside illumination image sensor achieved in the embodiment, which includes a pair of light receiving areas formed at each focus detection pixel. Since the structural elements disposed at positions lower than the light shielding film 30 among the structural elements in FIG. 19 are identical to those in FIG. 7, their explanation is not provided. As an alternative to the barriers 8 shown in FIG. 7, the image-capturing pixels 310 in FIG. 19 each include a light shielding member constituted with another color filter 9 disposed at a position immediately in front of the light shielding film 30. A transparent insulating film 31 fills the space between the color filter 9 directly above the light shielding film 30 and the color filter 9 located directly below the on-chip lens 10. The transparent insulating film 31 also embeds the space between the color filter 9 directly above the light shielding film 30 and the light shielding film 30 itself and the space between the light shielding film 30 and the back surface 408 of the single crystal silicon layer 401. However, the color filter 9 may be formed directly on the light shielding film 30 without a transparent insulating film 31 embedding the space above the light shielding film 30.

In the image sensor structured as described above, stray light 21 with a large angle of incidence is bound to pass through two different types of color filters 9, before it ever reaches the opening 11 in an adjacent unit pixel area 403. As explained earlier, two different types of color filters 9 achieve spectral sensitivity characteristics different from each other. For this reason, the light will have been fully attenuated by the time it reaches the opening 11 of the adjacent unit pixel area 403, and since color mixture (crosstalk) is thus prevented, an image of high quality can be generated.

Figure 20:
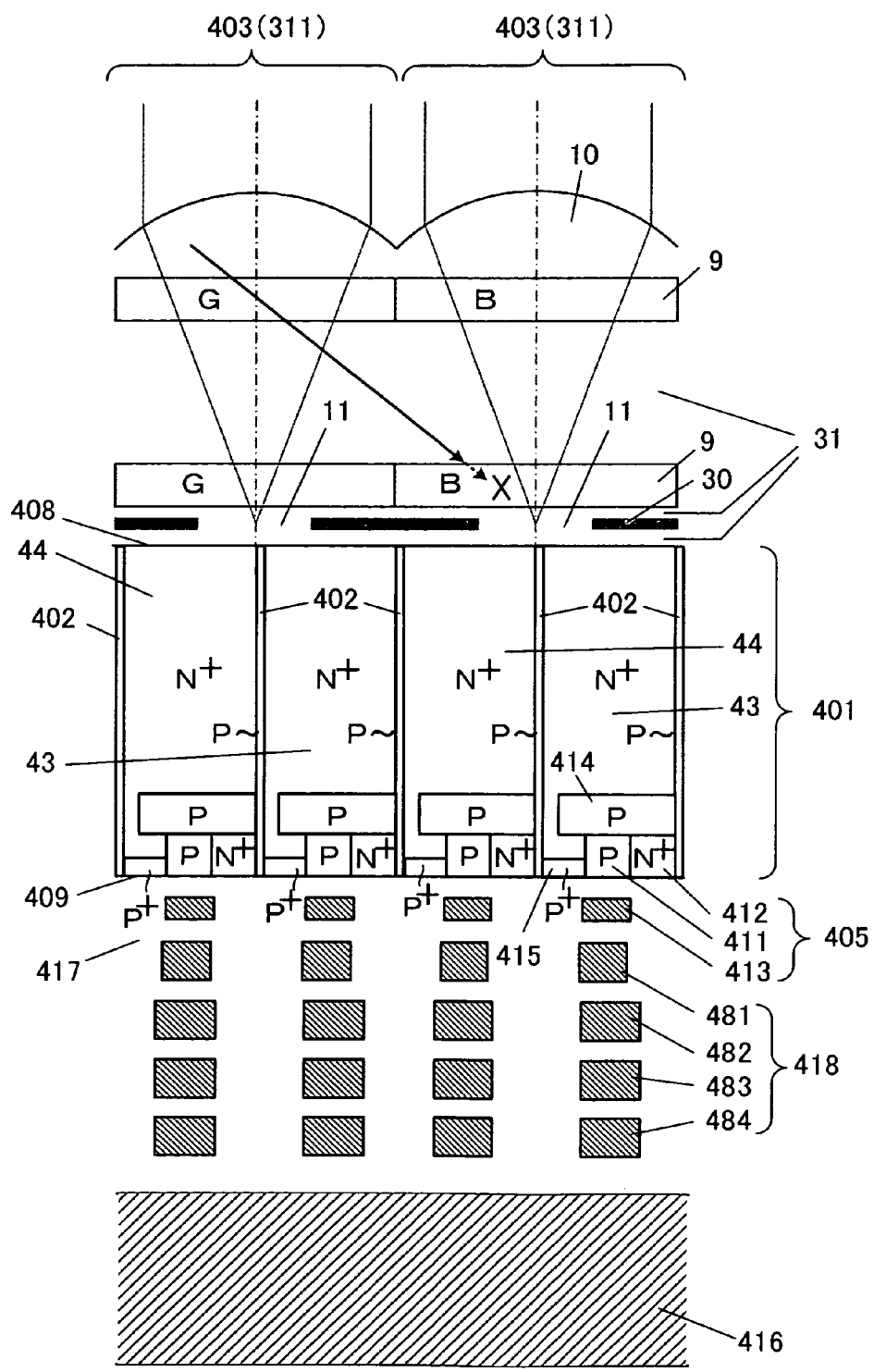
FIG. 20 is a sectional view of focus detection pixels.

FIG. 20 is a schematic sectional view of focus detection pixels 311 in the backside illumination image sensor achieved in the embodiment, which includes a pair of light receiving areas formed at each focus detection pixel. As an alternative to the barriers 8 shown in FIG. 8, the focus detection pixels 311 in FIG. 20 each include light shielding members constituted with two color filters 9, one disposed at a position directly behind the on-chip lens 10 and the other disposed at a position directly in front of an opening 11 in the light shielding film 30. A transparent insulating film 31 fills the space between the color filter 9 directly above the light shielding film 30 and the color filter 9 located directly below the on-chip lens 10. The transparent insulating film 31 also embeds the space between the color filter 9 directly above the light shielding film 30 and the light shielding film 30 itself and the space between the light shielding film 30 and the back surface 408 of the single crystal silicon layer 401. However, the color filter 9 may be formed directly on the light shielding film 30 without a transparent insulating film 31 embedding the space above the light shielding film 30.

In the image sensor structured as described above, stray light 21 with a large angle of incidence is bound to pass through two different types of color filters 9, before it ever reaches the opening 11 in an adjacent unit pixel area 403. As explained earlier, two different types of color filters 9 achieve spectral sensitivity characteristics different from each other. For this reason, the light will have been fully attenuated by the time it reaches the opening 11 of the adjacent unit pixel area 403, and since color mixture (crosstalk) is thus prevented, highly accurate focus detection is enabled.

Immediately to the rear of the opening 11 in the unit pixel area 403, a pair of photoelectric conversion elements 43 and 44, partitioned from each other by an element separating area 402 constituted with a P-type semiconductor, are disposed. On the side where the other principal plane of the single crystal silicon layer 401 is present, i.e., on the lower side where the front surface 409 is present in FIG. 20, a read circuit 405 via which signals from the pair of photoelectric conversion elements 43 and 44 are read out and wiring layers 418 are formed, together with a second element separating area 414, a positive charge storage area 415, a support base 416 and an insulating layer 417.

In the structure described above, the boundary between the light receiving areas 23 and 24 shown in FIG. 17A is formed with an element separating area 402, whereas the outer perimeter of the light receiving areas 23 and 24 is constituted with the opening 11.

The structure of the focus detection pixels 312 is basically identical to the structure of the focus detection pixels 311 shown in FIG. 20, except for their orientations, since they are rotated by 90° relative to the focus detection pixel 311.

While a color filter 9 is disposed at a position immediately to the rear of the on-chip lens 10 in each unit pixel area 403 in the FIGS. 19 and 20, similar advantages may be achieved by forming the on-chip lens 10 itself as a color filter.

In the example presented in FIGS. 19 and 20, color filters 9 are disposed at two positions in each unit pixel area 403. As a structural alternative, the entire space ranging from the on-chip lens 10 to the light shielding film 30 may be taken up by a single color filter without any transparent insulating film 31 embedding the space and similar advantages will be achieved in an image sensor adopting the alternative structure as well.

At the image sensor structured as described above, G-color component-based focus detection can be executed through phase comparison (image shift detection) of signals from the photoelectric conversion elements 43 at focus detection pixels 311 or 312 equipped with G-color filters and signals from the photoelectric conversion elements 44 at the focus detection pixels 311 or 312 equipped with G-color filters. In addition, R-color component-based focus detection can be executed through phase comparison (image shift detection) of signals from the photoelectric conversion elements 43 at focus detection pixels 311 or 312 equipped with R-color filters and signals from the photoelectric conversion elements 44 at the focus detection pixels 311 or 312 equipped with R-color filters.

At each focus detection pixel 311 or 312 equipped with a G-color filter, an image-capturing signal equivalent to an image-capturing signal that would be output at an image-capturing pixel 310 equipped with a G-color filter taking up the particular focus detection pixel position, can be generated by adding the signal from the photoelectric conversion elements 43 and the signal from the photoelectric conversion element 44. In addition, at each focus detection pixel 311 or 312 equipped with an R-color filter, an image-capturing signal equivalent to an image-capturing signal that would be output at an image-capturing pixel 310 equipped with an R-color filter taking up the particular focus detection pixel position, can be generated by adding the signal from the photoelectric conversion elements 43 and the signal from the photoelectric conversion element 44.

Since an image-capturing signal can be generated with a high level of accuracy in correspondence to each focus detection pixel position in this manner, better quality is assured for the captured image.

It is to be noted that the signal value representing the sum of the signals from the pair of photoelectric conversion elements 43 and 44 may be obtained by allowing the focus detection pixel 311 or 312 to output a sum signal indicating the sum of the signals from the pair of photoelectric conversion elements 43 and 44 added together by an adding circuit. As an alternative, the signals from the photoelectric conversion element 43 and the photoelectric conversion element 44 may be read out separately and then added together in an external circuit so as to obtain the signal value representing the sum of the signals from the pair of photoelectric conversion elements 43 and 44.

(3) Other Embodiments

The image sensors achieved in the embodiments described above include image-capturing pixels equipped with color filters disposed in a Bayer array. However, the color filters may be structured or arrayed differently from those described above, and the present invention may be adopted in conjunction with an image sensor having an array pattern other than the Bayer array pattern, such as a complementary color filter (green yellow Ye, magenta Mg and cyan Cy) array pattern.

Furthermore, the present invention may be adopted in a monochrome image sensor that does not include color filters.

It is to be noted that the present invention may be adopted in an image-capturing device other than a digital still camera, such as that described above, or a film-type still camera used in conjunction with interchangeable lenses that can be attached to the camera body. For instance, the present invention may be adopted in a digital still camera or a video camera with an integrated lens. The present invention may be further adopted in a compact camera module included as a built-in unit in a portable telephone or the like, a surveillance camera, a visual recognition device in a robot, an on-vehicle camera and the like.

The above described embodiments are examples, and various modifications can be made without departing from the scope of the invention.

What is claimed is:

1. A backside illumination image sensor that includes a semiconductor substrate with a plurality of photoelectric conversion elements formed thereat and a read circuit formed on a side where a front surface of the semiconductor substrate is present, and captures an image by outputting, via the read circuit, electrical signals generated as incident light having passed through an image forming optical system and having reached a side where a back surface of the semiconductor substrate is present, is received at the plurality of photoelectric conversion elements, comprising:

a light shielding film formed on a side where incident light enters the plurality of photoelectric conversion elements, with an opening formed therein in correspondence to each of the plurality of photoelectric conversion elements; and an on-chip lens formed at a position set apart from the light shielding film by a predetermined distance in correspondence to each of the plurality of photoelectric conversion elements, wherein:

the light shielding film and an exit pupil plane at which an exit pupil of the image forming optical system is present achieve a conjugate relation to each other with regard to the on-chip lens, the optical system is separate from the on-chip lens, and a radius of curvature R of the on-chip lens, a distance D from an apex of the on-chip lens to the light shielding film and an average refractive index n of a medium present between the on-chip lens and the light shielding film achieve a relationship expressed as:

$$D=R\cdot n/(n-1).$$

2. A backside illumination image sensor according to claim 1, wherein:

the plurality of photoelectric conversion elements are disposed in a two-dimensional grid array; and a pitch P of the two-dimensional grid array, a smallest F number F0 of the exit pupil of the image forming optical system and the distance D achieve a relationship expressed as:

$$F0\cdot P\cdot n > D > P\cdot n/(2\cdot(n-1)).$$

3. A backside illumination image sensor according to claim 2, wherein:

the radius of curvature over a periphery of the on-chip lens is greater than the radius of curvature at a central area of the on-chip lens.

4. A backside illumination image sensor that includes a semiconductor substrate with a plurality of photoelectric conversion elements formed thereat and a read circuit formed on a side where a front surface of the semiconductor substrate is present, and captures an image by outputting, via the read circuit, electrical signals generated as incident light having passed through an image forming optical system and having reached a side where a back surface of the semiconductor substrate is present, is received at the plurality of photoelectric conversion elements, comprising:

alight shielding film formed on a side where incident light enters the plurality of photoelectric conversion elements, with an opening formed therein in correspondence to each of the plurality of photoelectric conversion elements;

an on-chip lens formed at a position set apart from the light shielding film by a predetermined distance in correspondence to each of the plurality of, photoelectric conversion elements; and a light shielding member that prevents entry of passing light, which is part of the incident light that passes through the on-chip lens, into a photoelectric conversion element corresponding to an adjacent on-chip lens adjacent to the on-chip lens, among the plurality of photoelectric conversion elements, wherein:

the light shielding film and an exit pupil plane at which an exit pupil of the image forming optical system is present achieve a conjugate relation to each other with regard to the on-chip lens, the optical system is separate from the on-chip lens, the light shielding member is disposed between the on-chip lens and the light shielding film, the light shielding member is a barrier member disposed parallel to an optical axis of the on-chip lens; and an anti-reflection film is formed at a surface of the barrier member so as to prevent reflection of the passing light.

5. A backside illumination image sensor that includes a semiconductor substrate with a plurality of photoelectric conversion elements formed thereat and a read circuit formed on a side where a front surface of the semiconductor substrate is present, and captures an image by outputting, via the read circuit, electrical signals generated as incident light having passed through an image forming optical system and having reached a side where a back surface of the semiconductor substrate is present, is received at the plurality of photoelectric conversion elements, comprising:

a light shielding film formed on a side where incident light enters the plurality of photoelectric conversion elements, with an opening formed therein in correspondence to each of the plurality of photoelectric conversion elements;

an on-chip lens formed at a position set apart from the light shielding film by a predetermined distance in correspondence to each of the plurality of photoelectric conversion elements; and a light shielding member that prevents entry of passing light, which is part of the incident light that passes through the on-chip lens, into a photoelectric conversion element corresponding to an adjacent on-chip lens adjacent to the on-chip lens, among the plurality of photoelectric conversion elements, wherein:

the light shielding film and an exit pupil plane at which an exit pupil of the image forming optical system is present achieve a conjugate relation to each other with regard to the on-chip lens, the optical system is separate from the on-chip lens, the light shielding member is disposed between the on-chip lens and the light shielding film, the light shielding member includes a first color filter disposed near the on-chip lens and a second color filter assuming a color matching the color of the first color filter, which is disposed near the opening; and a color of the light shielding member is different from a color of a light shielding member disposed in conjunction with the adjacent on-chip lens adjacent to the on-chip lens.

\* \* \* \* \*